United States Patent
Tomii et al.

(10) Patent No.: US 6,339,236 B1
(45) Date of Patent: Jan. 15, 2002

(54) LIGHT RESPONSIVE SEMICONDUCTOR SWITCH WITH SHORTED LOAD PROTECTION

(75) Inventors: Kazushi Tomii, Soraku; Hideo Nagahama, Osaka; Yosuke Hagihara, Katano, all of (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 09/671,434

(22) Filed: Sep. 27, 2000

(30) Foreign Application Priority Data

Sep. 27, 1999 (JP) .......................................... 11-273395
Jan. 26, 2000 (JP) .......................................... 12-016410

(51) Int. Cl.$^7$ ........................................... H01L 27/148
(52) U.S. Cl. ...................... 257/228; 257/227; 257/363; 257/223; 257/290; 257/355; 257/360
(58) Field of Search ................ 257/228, 227, 257/223, 290, 363, 355, 360

(56) References Cited

U.S. PATENT DOCUMENTS

| 4,924,343 A | | 5/1990 | Niemi |
| 5,006,949 A | | 4/1991 | Guajardo |
| 5,229,649 A | * | 7/1993 | Nielson et al. ............... 307/31 |

FOREIGN PATENT DOCUMENTS

| JP | 11-163706 | 6/1999 |
| JP | 3018816 | 1/2000 |
| JP | 2000-012853 | 1/2000 |

* cited by examiner

Primary Examiner—Fetsum Abraham
(74) Attorney, Agent, or Firm—Oblon, Spivak, McClelland, Maier & Neustadt, P.C.

(57) ABSTRACT

An improved light responsive semiconductor switch with shorted load protection capable of successfully interrupting a load overcurrent. The switch is includes an output transistor which is triggered by a photovoltaic element to connect a load to a power source thereof, and an overcurrent sensor which provides an overcurrent signal upon seeing an overcurrent condition in the load. A shunt transistor is connected in series with a current limiting resistive element across the photovoltaic element to define a shunt path of flowing the current from the photovoltaic element through the current limiting resistive element away from the output transistor. A latch circuit is included to be energized by the photovoltaic element and to provide an interruption signal once the overcurrent signal is received and hold the interruption signal. The interruption signal turns on the shunt transistor so as to flow the current from the photovoltaic element through the shunt path, thereby turning off the output transistor for interruption of the overcurrent. The current limiting resistive element is connected in series with the shunt transistor to limit the current from the photovoltaic element when the shunt transistor is turned on, thereby providing a supply voltage from the photovoltaic element to the latch circuit. Thus, the latch circuit is enabled to keep providing the interruption signal for reliable interruption of the overcurrent.

19 Claims, 18 Drawing Sheets

LIGHT RESPONSIVE SEMICONDUCTOR SWITCH WITH SHORTED LOAD PROTECTION

BACKGROUND OF THE INVENTION

1. Field of the Invention

The present invention relates to a light responsive semiconductor switch with shorted load protection for use in an optical relay.

2. Description of the Prior Art

Japanese Patent Publication No. 11-163706 discloses a light responsive semiconductor switch for use in an optical relay. The switch includes a photovoltaic element which provides an operating voltage upon absorption of light from a light source, and an output transistor which is triggered by the operating voltage to become conductive for connecting a load to a power source. In order to protect the output transistor from an overcurrent due to an accidental short-circuiting of the load, the switch includes an overcurrent sensor for detection of the overcurrent condition, and a shunt transistor which, in response to the overcurrent condition, becomes conductive to flow the current from the photovoltaic element away from the output transistor to turn if off for interruption of the overcurrent. Further, the switch includes a latch circuit which, in response to the overcurrent condition, provides and holds an interruption signal fed to a control electrode of the output transistor to keep turning off the output transistor for continued interruption of the overcurrent. In this prior art, the shunt transistor is included in the latch circuit to be responsible also for the latching operation. Therefore, the shunt transistor has to satisfy two different requirements, one for the turning off of the output transistor, and the other for holding the interruption signal applied to the control electrode of the output transistor in association with a resistor in the latch circuit. With this restriction to the shunt transistor common to the latch circuit, it is rather difficult to combine the two requirements against the use of the photovoltaic element of varying current generating capacity. For example, when the photovoltaic element having a large current generating capacity is used to apply a correspondingly high voltage to the control electrode of the output transistor for rapidly turning it on, the conduction of the shunt transistor made for the latching operation may not be enough to lower the voltage applied to the control electrode of the output transistor below a threshold voltage thereof, failing to turn off the output transistor even when the shunt transistor is made conductive to draw the current from the photovoltaic element. Accordingly, the prior switch poses limitations to a circuit design and is not satisfactory for complete interruption of the overcurrent irrespective of the current generating capacity of the photovoltaic element.

SUMMARY OF THE INVENTION

In view of the above insufficiency in the prior art, the present invention has been achieved to provide an improved light responsive semiconductor switch with shorted load protection which is capable of successfully interrupting a load overcurrent. The semiconductor switch in accordance with the present invention comprises an output switching transistor connected between a pair of output terminals which are adapted for connection to a load circuit composed of a load and a power source energizing the load. The output switching transistor has a control electrode with a threshold voltage at which the output switching transistor conducts to connect the load to the power source. A photovoltaic element is included in the switch to generate an electric power upon absorption of light from a light source. The electric power provides an operating voltage decreasing with an increasing current flowing from the photovoltaic element. An overcurrent sensor is coupled to the load circuit to provide an overcurrent signal when the load circuit sees an overcurrent flowing through the load from the power source. A shunt transistor is connected in series with a current limiting resistive element across the photovoltaic element to define a shunt path of flowing the current from the photovoltaic element through the current limiting resistive element away from the output switching transistor. Also included in the switch is a latch circuit which is connected to the overcurrent sensor and the shunt transistor. The latch circuit is energized by the photovoltaic element and provides an interruption signal once the overcurrent signal is received and holds the interruption signal after the removal of the overcurrent signal. The interruption signal causes the shunt transistor to become conductive to flow the current from the photovoltaic element through the shunt path, lowering the operating voltage being applied to the control electrode of the output switching transistor below the threshold voltage so as to turn off the output switching transistor for disconnection of the load from the power source.

The characterizing feature of the present invention resides in that the shunt transistor and the current limiting resistive element are formed separately from the latch circuit, and that the current limiting resistive element is connected between the control electrode of the output switching transistor and the positive electrode of the photovoltaic element so as to limit the current from the photovoltaic element, when said shunt transistor is conductive, to such an extent as to lower the operating voltage being applied to the control electrode of the output switching transistor below the threshold voltage, while allowing the photovoltaic element to provide a supply voltage to the latch circuit for holding the interruption signal. Thus, the series combination of the current limiting resistive element and the shunt transistor which are separately formed from the latch circuit can assure to provide the supply voltage to the latch circuit and at the same time to limit the operative voltage being applied to the control electrode of the output switching transistor, so as to keep the interruption signal from the latch circuit on one hand, and to turn off the output switching transistor without fail in response to the interruption signal on the other hand, enabling successful and reliable interruption of the overcurrent. Also, since the current limiting resistive element is separately formed from the latch circuit, it is readily possible to assure the above interruption of the overcurrent irrespective of varying current generating capacity of the photovoltaic element, simply by selecting the impedance of the current limiting resistive element. With this result, the output transistor can be protected completely from the overcurrent in the load circuit.

In one version of the present invention, the overcurrent sensor is realized by a current sensing resistor inserted in the load circuit, and a transistor switch which is disposed to receive a voltage developed across the current sensing resistor to provide the overcurrent signal to the latch circuit when the voltage exceeds a predetermined level.

In another version of the present invention, the overcurrent sensor is realized by a current sensing resistor connected in series with a bypass switching transistor between the output terminals and in parallel with the output switching transistor, and a transistor switch which is disposed to receive a voltage developed across the current sensing resistor to provide the overcurrent signal to the latch circuit when the voltage exceeds a predetermined level.

For driving the load energized the DC power supply, the output switching transistor is preferably defined by a single metal oxide semiconductor field-effect transistor (MOSFET) whose gate-source is connected across the photovoltaic element, and whose drain-source is connected between the output terminals.

For driving the load energized by the AC power supply, the switch is preferred to include a pair of output switching transistors each in the form of a metal oxide semiconductor field-effect transistor (MOSFET). The two output switching transistors are connected in series between the output terminals with sources of the individual MOSFETs being connected to each other and with gates of the individual MOSFETs being commonly connected to receive the operating voltage from the photovoltaic element.

Preferably, the latch circuit is realized by a flip flop having a set input, a reset input, and an output. The set input is connected to receive the overcurrent signal and the reset input is connected to receive the operating voltage from the photovoltaic element, while the output is connected to turn on and off the shunt transistor.

The shunt transistor is preferred to be a metal oxide semiconductor field-effect transistor (MOSFET) whose drain-source is connected in series with the current limiting resistive element across the photovoltaic element. In this connection, the flip-flop is realized by a combination of a first resistive element and a first metal oxide semiconductor field-effect transistor (MOSFET) whose drain-source is connected in series with the first resistive element across the photovoltaic element, and a combination of a second resistive element and a second metal oxide semiconductor field-effect transistor (MOSFET) whose drain-source is connected in series with the second resistive element across the photovoltaic element. The first MOSFET has a gate connected to a point between the second resistive element and a drain of the second MOSFET. The second MOSFET has a gate connected to a point between the first resistive element and a drain of the first MOSFET. The point between the second resistive element and the drain of the second MOSFET is also connected to the gate of the shunt transistor (MOSFET) so as to provide the interruption signal to the gate of the shunt transistor. The second MOSFET receives at its gate the operating voltage from the photovoltaic element through the first resistive element so as to become conductive, thereby lowering the operating voltage applied through the second resistive element to the gate of the first MOSFET and to the gate of the shunt transistor (MOSFET) to make the first MOSFET and the shunt transistor (MOSFET) non-conductive, thereby applying the operating voltage to the control electrode of the output switching transistor to turn it on. The second MOSFET also receives at its gate the overcurrent signal which makes the second MOSFET nonconductive, thereby raising the voltage applied to the gates of the first MOSFET and the shunt MOSFET so as to make the first MOSFET and the shunt transistor (MOSFET) conductive, which keeps the second MOSFET non-conductive for continued conduction of the shunt transistor (MOSFET) for keeping the interruption of the output switching transistor until removal of the operating voltage from the photovoltaic element.

For the above circuit configuration, each of the current limiting resistive element, the first resistive element and the second resistive element is preferably in the form of a punch-through space charge resistor. The punch-through space charge resistor is realized by a semiconductor substrate having a conductive type which is one of n-type and p-type, a well diffused in the surface of the substrate and being of a conductive type opposite of the substrate, and a pair of regions diffused in the surface of the well in a spaced relation with each other. The regions are of the same conductive type as the substrate. Electrodes are respectively formed on the regions to apply the operating voltage between the regions partly through the well. In this condition, the regions are cooperative to form therebetween a depletion layer responsible for carrying a minute current and therefore defining resistance for each of the current limiting resistive element, the first resistive element and the second resistive element. Since the punch-through space charge resistor can realized into a micro structure while exhibiting a high resistance, the whole switch can be made compact even when the photovoltaic element of small current generating capacity is utilized to require a considerably high resistance for each resistive element.

Alternatively, the current limiting resistive element, the first resistive element and the second resistive element may be realized by diodes, respectively.

Preferably, the output switching transistor is realized by a metal oxide semiconductor field-effect transistor (MOSFET) having a gate defining the control electrode. A zener diode is connected across gate-source of the output switching transistor in parallel with the photovoltaic element in such a manner as to connect a cathode of zener diode to the gate of the output switching transistor. The zener diode is selected to have a breakdown voltage higher than an open-circuit voltage of the photovoltaic element. Thus, even when an excessively large voltage is applied to the output switching transistor due to the load short circuit, the zener diode can clamp the gate voltage of the output switching transistor to the breakdown voltage so as to protect the output transistor from destructive voltage.

A diode may be being connected across the current limiting resistive element with an anode of the diode connected to the gate of the output switching transistor. Thus, when the photovoltaic elements is turned off to cease providing the operating voltage, the diode establishes a bypass across the current limiting resistive element for discharging the charges accumulated in the gate of the output switching transistor, thereby speeding up the discharge to rapidly turn off the output switching transistor.

In this connection, a resistor may be connected in series with the diode across the current limiting resistive element in order to avoid malfunction of the short-circuit interruption of the switch when the load circuit is subjected to a high voltage noise such as a lightning surge. Upon occurrence of the high voltage noise while the output switching transistor is kept turned on, a rushing current would flow from the drain to the gate of the output switching transistor (MOSFET) through a parasitic capacitance in the drain-gate path into the photovoltaic element, thereby instantaneously canceling the operating voltage of the photovoltaic element. If this should occur, the latch circuit would be reset to turn off the shunt transistor, disabling the interruption of the overcurrent in the load circuit, failing to protect the load circuit as well as the output switching transistor. However, the resistor included in the above bypass can well delimit the rushing current to avoid the unintended reset of the latch circuit and assure a safe protection of interrupting the overcurrent against the high voltage noise.

Instead of the diode connected across the current limiting resistive element, a discharging metal oxide semiconductor field-effect transistor (MOSFET) may be utilized for the same purpose of rapidly turning off the output switching transistor in response to the deactivation of the photovoltaic element. The discharging MOSFET has a source coupled to a connection between the current limiting resistor element and the positive electrode of the photovoltaic element and has a drain and a gate which are commonly connected to the gate of the output switching transistor for discharging the charge accumulated in the gate of the output switching transistor through the MOSFET when the photovoltaic element is deactivated.

Preferably, the transistor forming the overcurrent sensor is realized by a third metal oxide semiconductor field-effect transistor (MOSFET) which provides the overcurrent signal to the latch circuit upon being turned on. In this connection, an additional photovoltaic element may be used to provide an offset voltage, upon absorption of the light, which is added to a detected voltage appearing across the current sensing resistor. The additional photovoltaic element is connected in circuit to the third MOSFET so as to turn on the third MOSFET when the detected voltage plus the offset voltage exceed a predetermined level. Thus, even a relatively low detection voltage across the current sensing resistor can successfully trigger the third MOSFET for increasing sensitivity of the third MOSFET or the overcurrent sensor to the overcurrent condition. Therefore, the third MOSFET can well respond to a low level overcurrent for successfully protecting the output switching transistor therefrom.

In another version of the present invention, the switch further includes a second shunt transistor in the form of a metal oxide semiconductor field-effect transistor (MOSFET) connected across the shunt transistor. The second shunt transistor has a drain which is connected to a point between the control electrode of the output switching transistor and the current limiting resistive element, and has a source which is connected to the source of the shunt transistor. The second shunt transistor has a gate which is connected to directly receive the voltage developed across the current sensing resistor such that, in response to the voltage of the current sensing resistor exceeding the predetermined level, the second shunt transistor becomes conductive to flow the current from the photovoltaic element through the current limiting resistive element and through the second shunt transistor away from the output switching transistor prior to the latch circuit responding to provide the interruption signal of turning on the shunt transistor. With this arrangement, the output switching transistor can be turned off for interruption of the overcurrent in prompt response to the overcurrent condition without having to wait for the actuation of the latch circuit, and can be held turned off by the subsequently actuated latch circuit. Thus, it is readily possible to give a more reliable protection of the output switching transistor even against an instantaneous overcurrent flow.

The switch may include a biasing means for supplying a bias current from the photovoltaic element to the gate of the shunt transistor when the latch circuit provides the interruption signal in response to the overcurrent signal. With the addition of the bias current or the bias voltage to the gate of the shunt transistor, the shunt transistor can be promptly triggered to turn on for rapid interruption of the overcurrent through the output switching transistor, thereby protecting the output switching transistor as well as Fe associated element effectively.

Also, the switch may include a block circuit for blocking the current of the photovoltaic element from flowing to the gate of the output switching transistor when the latch circuit provides the interruption signal in response to the overcurrent signal. With the inclusion of the blocking circuit, the current from the photovoltaic element is intensively utilized for triggering the shunt transistor, thereby quickening the interruption of the overcurrent for immediate protection of the output switching transistor against the overcurrent.

Further, the overcurrent sensor may include a low-pass filter which negates or cancel a high frequency voltage appearing across the current sensing resistor so that the overcurrent sensor provides the overcurrent signal to the latch circuit only when the voltage across the current sensing resistor exceeds the predetermined level and lasts over a certain time period. Thus, the latch circuit is prevented from providing the interruption signal in response to noncritical overcurrent appearing only instantaneously in the load circuit such as minor noises and rushing current which does not require the protection of the output switching transistor.

Moreover, the switch may include a delay timer which delays providing the overcurrent signal from the overcurrent sensor to the latch circuit for a short time period immediately upon the photovoltaic element generating the electric power, thereby canceling a transient voltage appearing across the current sensing resistor immediately after the activation of the photovoltaic element. With the inclusion of the delay timer, the output switching transistor can be prevented from responding to noncritical overcurrent appearing immediately after the actuation of the photovoltaic element for assuring reliable switching operation.

These and still other objects and advantageous features of the present invention will become more apparent from the following description of the embodiments when taken in conjunction with the attached drawings.

DETAILED DESCRIPTION OF THE EMBODIMENTS

Figure 1:
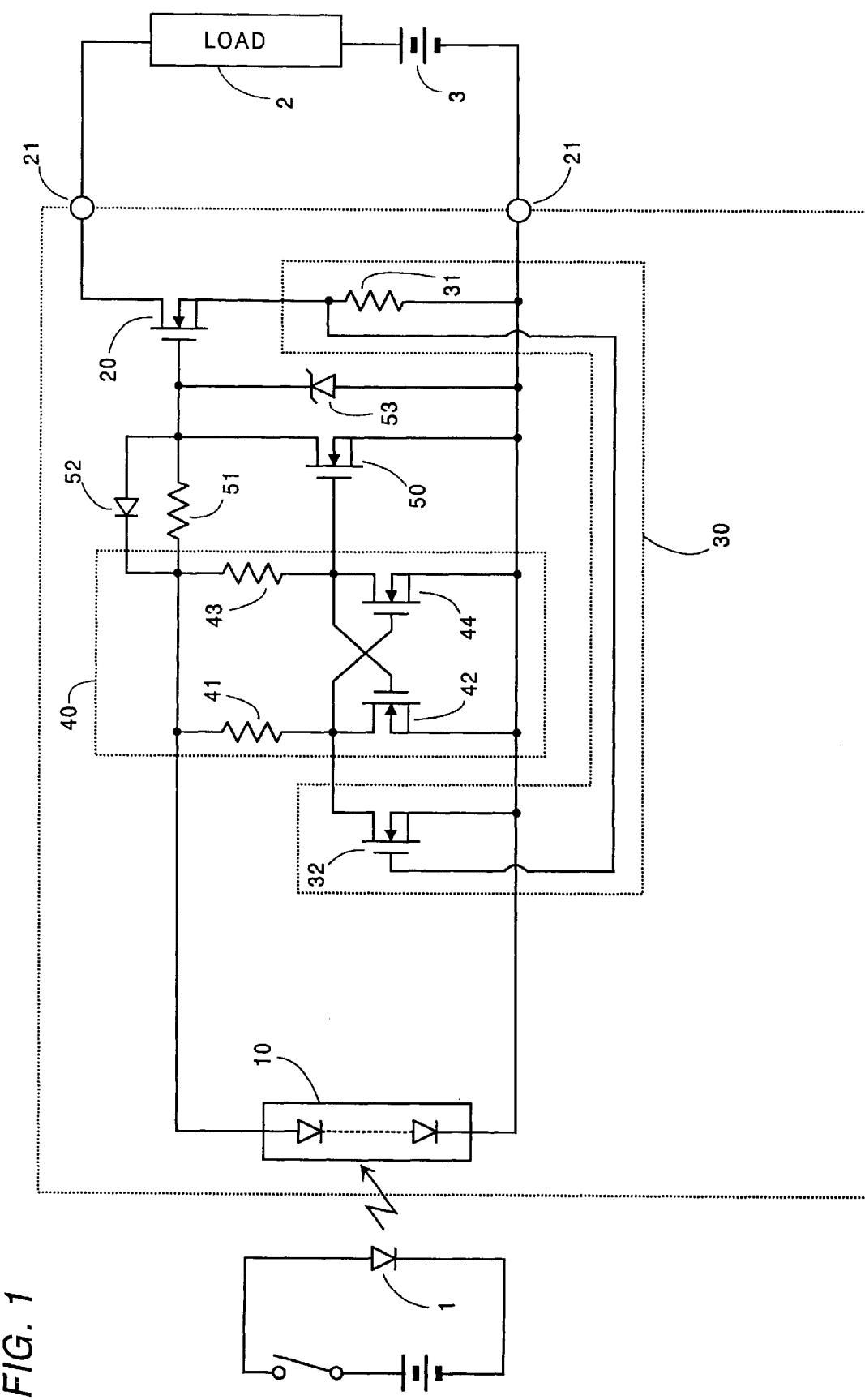
FIG. 1 is a circuit diagram of a light responsive semiconductor switch with shorted load protection in accordance with a first embodiment of the present invention.

First Embodiment <FIG. 1>

Referring now to FIG. 1, there is shown a light responsive semiconductor switch in accordance with a first embodiment of the present invention. The switch is utilized in combination with a light emitting diode 1 to constitute an optical relay for connecting and disconnecting a load 2 to and from its power source 3. The switch includes a photovoltaic element 10 in the form of a photo-diode array which generates an electric power upon absorption of a light from the light emitting diode 1. The electric power gives an operating voltage which decreases with an increasing current from the photo-diode array 10. The operating voltage is applied to trigger an output switching transistor 20 in the form of an n-channel enhancement metal oxide field-effect transistor (MOSFET) whose gate-source is connected across the photo-diode array 10. The output MOSFET 20 has a drain and a source connected respectively to output terminals 21 which are adapted in use for connection with a load circuit composed of the load 1 and the power source 3. The gate of output MOSFET 20 is connected to receive the operating voltage from the photo-diode array 10 so that output MOSFET 20 becomes conductive, in response to the activation of the photo-diode array 10, for connection of the load 2 to the power source 3. In order to protect the switch, particularly the output MOSFET 20 from being damaged by an overcurrent which may flow through the load circuit due to an accidental short-circuiting of the load, the switch includes an overcurrent sensor 30, a latch circuit 40, and a shunt transistor 50 which are cooperative to keep the output MOSFET 20 turned off for interruption of the overcurrent once the overcurrent condition occurs.

The overcurrent sensor 30 is composed of a current sensing resistor 31 connected between the source of output MOSFET 20 and the output terminal 21, and a MOSFET 32 whose gate is connected to receive a detection voltage across resistor 31 so as to become conductive when the detection voltage exceeds a predetermined level indicative of the overcurrent. MOSFET 32 has a drain connected through a first resistor 41 to a positive electrode of the photo-diode array 10 and has a source connected to a negative electrode of the photo-diode array 10.

The latch circuit 40 is in the form of a flip-flop composed of a series combination of the first resistor 41 and a first MOSFET 42 connected across the photo-diode array 10, and a series combination of a second resistor 43 and a second MOSFET 44 across the photo-diode array 10. The first MOSFET 42 has its gate coupled to a connection between the second resistor 43 and a drain of the second MOSFET 44, while the second MOSFET 44 has its gate coupled to a connection between the first resistor 41 and a drain of the first MOSFET 42. The shunt transistor 50 is also a MOSFET whose drain-source is connected in series with a current limiting resistor 51 across the photo-diode array 10 and is connected across gate-source of the output MOSFET 20. The shunt MOSFET 50 has a gate coupled to the connection between the second resistor 43 and the drain of the second MOSFET 44. The latch circuit 40 is configured such that, upon activation of the photo-diode array 10, the second MOSFET 44 is first to become conductive, thereby lowering voltage applied to the gates of the first MOSFET 42 and the shunt MOSFET 50 to keep the MOSFETs 42 and 50 non-conductive. When MOSFET 32 becomes conducive in response to the overcurrent condition, the second MOSFET 44 becomes non-conductive to thereby make the first MOSFET 42 and the shunt MOSFET 50 conductive, thereby drawing the current from the photo-diode array 10 through the shunt MOSFET 50 away from the output MOSFET 20 and therefore turning off the output MOSFET 50 for interruption of the overcurrent in the load circuit. This condition is kept until the photo-diode array 10 is deactivated. In this sense, the latch circuit 40, i.e., the flip flop has set input defined at the connection between the first resistor 41 and the first MOSFET 42 to receive an overcurrent signal which is caused by the conduction of MOSFET 22 upon occurrence of the overcurrent condition. The flip-flop has a rest input defined at a connection between the first resistor 41 and the positive electrode of the photo-diode array 10 to receive the operating voltage from the photo-diode array 10, while the flip-flop has an output defined at the connection between the second resistor 43 and the second MOSFET 44 to issue an interruption signal to the gate of the shunt MOSFET 50 once MOSFET 32 applies the overcurrent signal to the set input. Thus, the interruption signal is held until the switch is reset by deactivation of the photo-diode array 10.

The current limiting resistor 51 is inserted between the gate of the output MOSFET 20 and the positive electrode of the photo-diode array 10 at such a location as to limit a shunt current flowing through the shunt MOSFET from the photo-diode array 10 when the latch circuit 40 operates to provide the interruption signal, thereby affording a sufficient voltage being applied to the latch circuit 40 from the array 10, whereby the latch circuit 40 is kept energized by the array 10 to continue providing the interruption signal.

A diode 52 is connected across the resistor 51 with its anode coupled to the gate of the output MOSFET 20 to establish a bypass across the resistor for releasing the electrical charge accumulated in the gate of the output MOSFET 20 when the array 10 is deactivated, thereby speeding up the discharge for rapid turn off of the output MOSFET. A zener diode 53 is connected across gate-source of the output MOSFET 20 with a cathode of zener diode 53 connected to the gate of output MOSFET 20. The zener diode 53 is also connected across the photo-diode array 10 and has a breakdown voltage higher than an open-circuit voltage of the array 10. When an excessively large voltage is applied to the output MOSFET 20 due to the short-circuiting of the load, the zener diode 53 clamps the gate voltage of output MOSFET 20 to the breakdown voltage for protecting it from destructive voltage.

Figure 2:
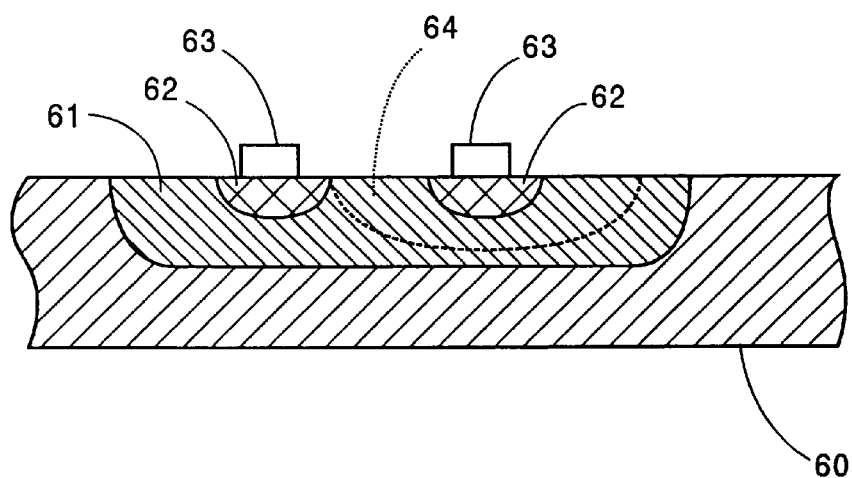
FIG. 2 is a sectional view illustrating a punch-through space charge resistor utilized in the above switch.

Referring now to FIG. 2, there is shown a punch-through space charge resistor element utilized for the resistors 41, 43, and 51 of the circuit of FIG. 1. The punch-through space charge resistor is formed in a semiconductor substrate 60 of n-type or p-type. A well 61 of the conductive type opposite of the substrate is diffused in the surface of the substrate 60, and a pair of regions 62 of the same conductive type as the substrate are diffused in the surface of the well 61 in a spaced relation with each other. Formed respectively on the regions 62 are electrodes 63 which apply the operating voltage between the regions partly through the well. With the application of the operating voltage, the regions 62 are cooperative to form therebetween a depletion layer 64 responsible for carrying a minute current and therefore defining resistance of high resistance. Thus configured punch-through space charge resistor can realized into a micro structure while exhibiting a high resistance. Therefore, the whole switch can be made compact when the photo-diode array 10 of small current generating capacity is utilized to require a considerably high resistance for each of the resistors 41, 43, and 51.

Figure 3:
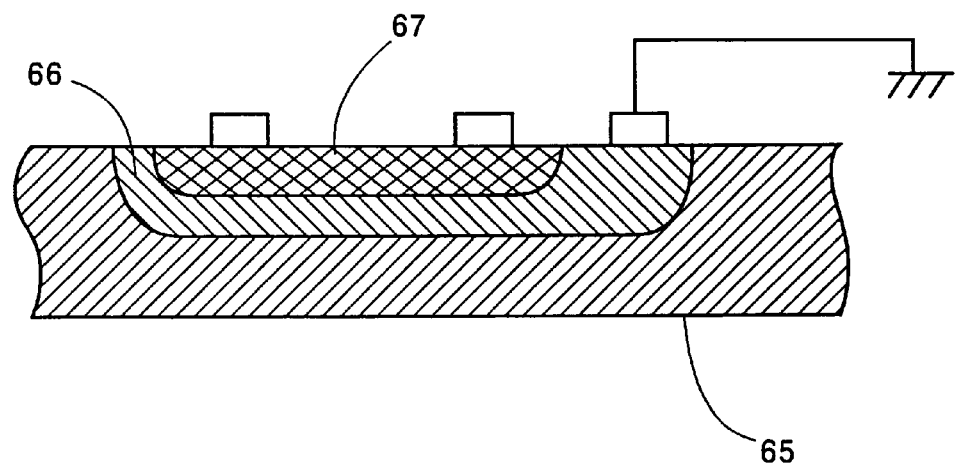
FIG. 3 is a sectional view illustrating a diffused resistor utilized in the above switch.

FIG. 3 shows a diffused resistor which may be utilized as an alternative resistive element for an alternative resistive element which may be utilized as the resistors 41, 43, and 51. The diffused resistor comprises a semiconductor substrate 65 of n-type or p-type, a well 66 of opposite conductive type, and a region 67 of the same conductive type as the substrate diffused in the surface of the well 66. With the well 66 being grounded to earth, the region 67 serves as a resistive element of high resistance. Thus, the high resistance can be achieved with a microstructure to make the switch compact.

Figure 4:
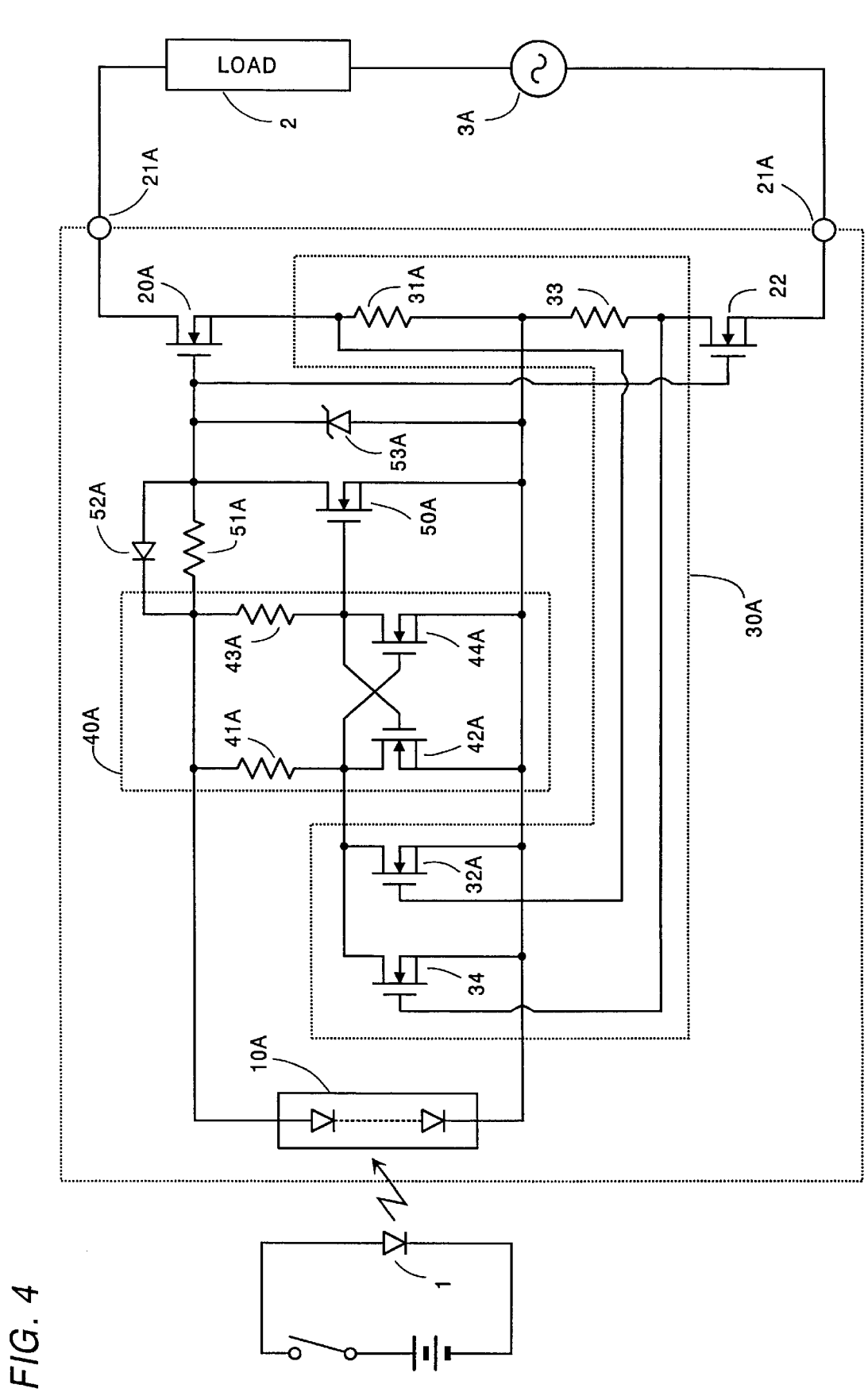
FIG. 4 is a semiconductor switch in accordance with a second embodiment of the present invention.

Second Embodiment <FIG. 4>

Referring to FIG. 4, there is shown a light responsive semiconductor switch in accordance with a second embodiment of the present invention. The switch of this embodiment is designed for a load circuit of energizing the load 2 with an AC power source 3A, and is identical to the first embodiment except for the use of an additional output MOSFET 22 and for the inclusion of an additional current sensing resistor 33, and an additional sensor MOSFET 34 in the overcurrent sensor 30A. Like elements are designated by like reference numerals with a suffix letter of "A". The additional output MOSFET 22 is connected in series with the output MOSFET 20A between the output terminals 21A with the sources of MOSFETs 20A and 22 being connected to each other and with the gates of MOSFETs 20A and 22 being commonly connected to receive the operating voltage from the photo-diode array 10A. The additional resistor 33 is connected in series with resistor 31A between the output terminals 21A to provide a resulting voltage to a gate of the additional sensor MOSFET 34. The additional sensor MOSFET 34 has its drain-source connected in parallel with drain-source of MOSFET 32A such that, when either or both of resistors 31A and 33 sees the overcurrent condition, the overcurrent sensor 30A generates the overcurrent signal to lower the voltage applied to the second MOSFET 44A of the latch circuit 40A, thereby turning on the shunt MOSFET 50A to interrupt the overcurrent in the load circuit.

Figure 5:
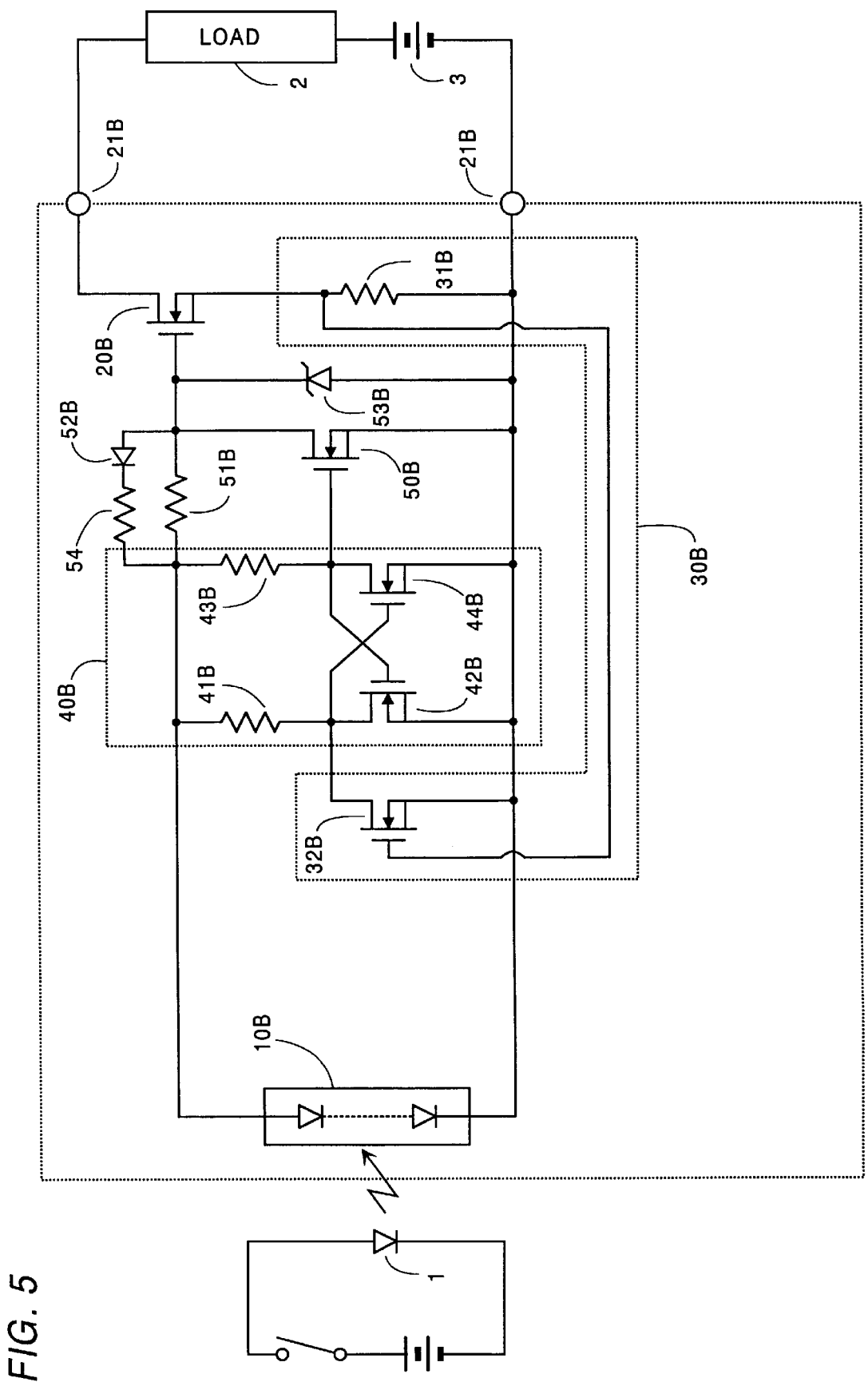
FIG. 5 is a circuit diagram in accordance with a first modification of the first embodiment.

FIG. 5 shows a first modification of the first embodiment which is identical to the first embodiment except for an addition of a resistor 54 in series with the diode 52B across the current limiting resistor 51B. Like elements are designated by like reference numerals with a suffix letter of "B". The resistor 54 is included in the circuit so as to avoid malfunction of the short-circuit interruption of the switch when the load circuit is subjected to a high voltage noise such as a lightning surge. When the high voltage noise appears in the load circuit while the output MOSFET 20B is on, a rushing current would flow from the drain to the gate of the output MOSFET 20B through a parasitic capacitance in the drain-gate of MOSFET 20B into the photo-diode array 10B, thereby instantaneously canceling the operating voltage of array 10B and therefore resetting the latch circuit 40B. If this should occur, the shunt MOSFET 50B would be turned off, disabling the interruption of the overcurrent in the load circuit even under the overcurrent condition caused by the high voltage, whereby the latch circuit 40B fails to protect the load circuit as well as the output MOSFET 20B. In order to avoid the unintended reset of the latch circuit 40B, the resistor 54 is included to delimit the rushing current, assuring a safe protection against the overcurrent condition caused by the instantaneous high voltage applied to the load circuit.

It should be noted in this connection that the features of this modification as well as other modifications and embodiments hereinafter described can be equally applied to the second embodiment of FIG. 4.

Figure 6:
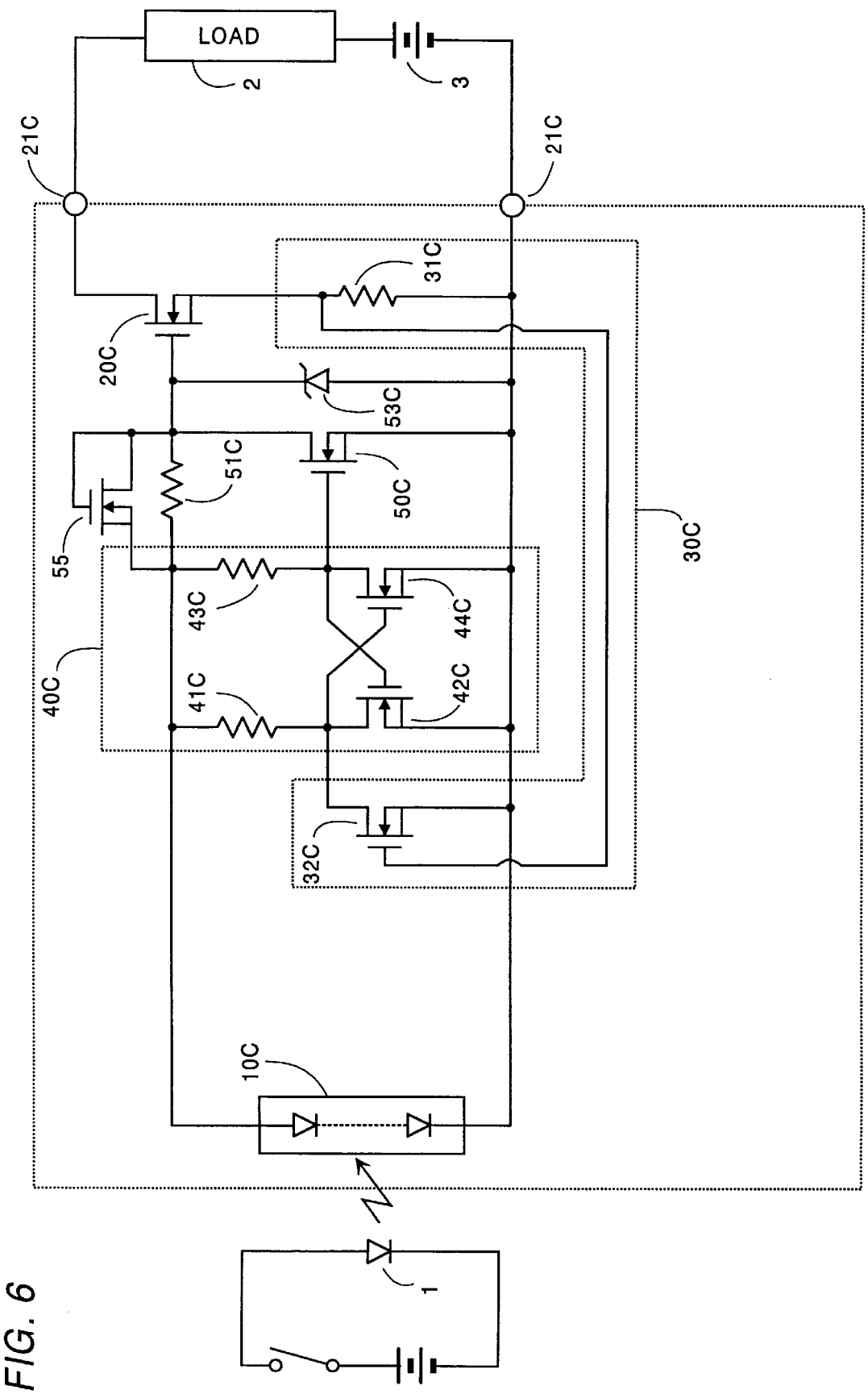
FIG. 6 is a circuit diagram in accordance with a second modification of the first embodiment.

FIG. 6 shows a second modification of the first embodiment which is identical to the first embodiment except that a discharging MOSFET 55 is employed instead of the diode 52 connected across the current limiting resistor for the purpose of rapidly turning off the output MOSFET in response to the deactivation of the photo-diode array 10C. Like elements are designated by like numerals with a suffix letter of "C". The discharging MOSFET 55 has a source coupled to a connection between the current limiting resistor 51C and the positive electrode of the photo-diode array 10C, and has a drain and a gate which are commonly connected to the gate of the output MOSFET 20C for discharging the charge accumulated in the gate of the output MOSFET 20C through the MOSFET 55 when the photo-diode array 10 is deactivated, enabling to turn off the MOSFET 20C in prompt response to the deactivation of the array 10.

Figure 7:
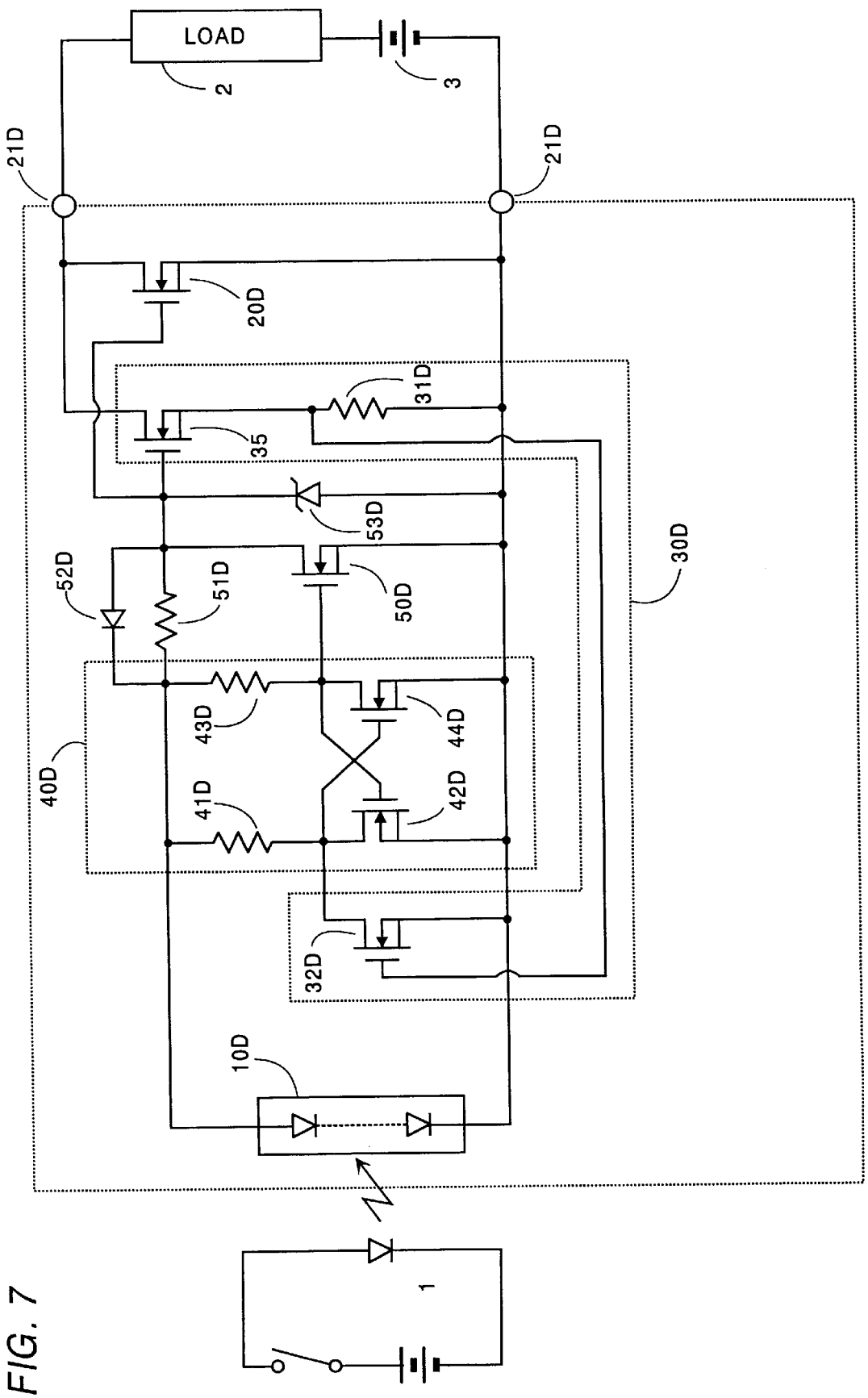
FIG. 7 is a circuit diagram of a light responsive semiconductor switch in accordance with a third embodiment of the present invention.

Third Embodiment <FIG. 7>

Referring to FIG. 7, there is shown a light responsive semiconductor switch in accordance with a third embodiment of the present invention which is identical to the first embodiment except for the inclusion of a bypass MOSFET 35 in the overcurrent sensor 30D. Like elements are designated by like reference numerals with a suffix letter of "D". The bypass MOSFET 35 has its source-drain connected in series with the current sensing resistor 31D across the drain-source of the output MOSFET 20D, and has its gate to the gate of the output MOSFET 20D to commonly receive the operating voltage from the photo-diode array 10D. The bypass MOSFET 35 and the resistor 31D form a high resistance path across the output MOSFET 20D to flow a fraction of the load current through the resistor 31D merely for detection of the overcurrent, allowing to flow the substantial load current through the output MOSFET 20D. When the overcurrent sensor 30D detects the overcurrent, the latch circuit 40D responds to keep the shunt MOSFET SOD non-conductive, thereby turning off the MOSFETs 20D and 35 for interruption of the load current.

Figure 8:
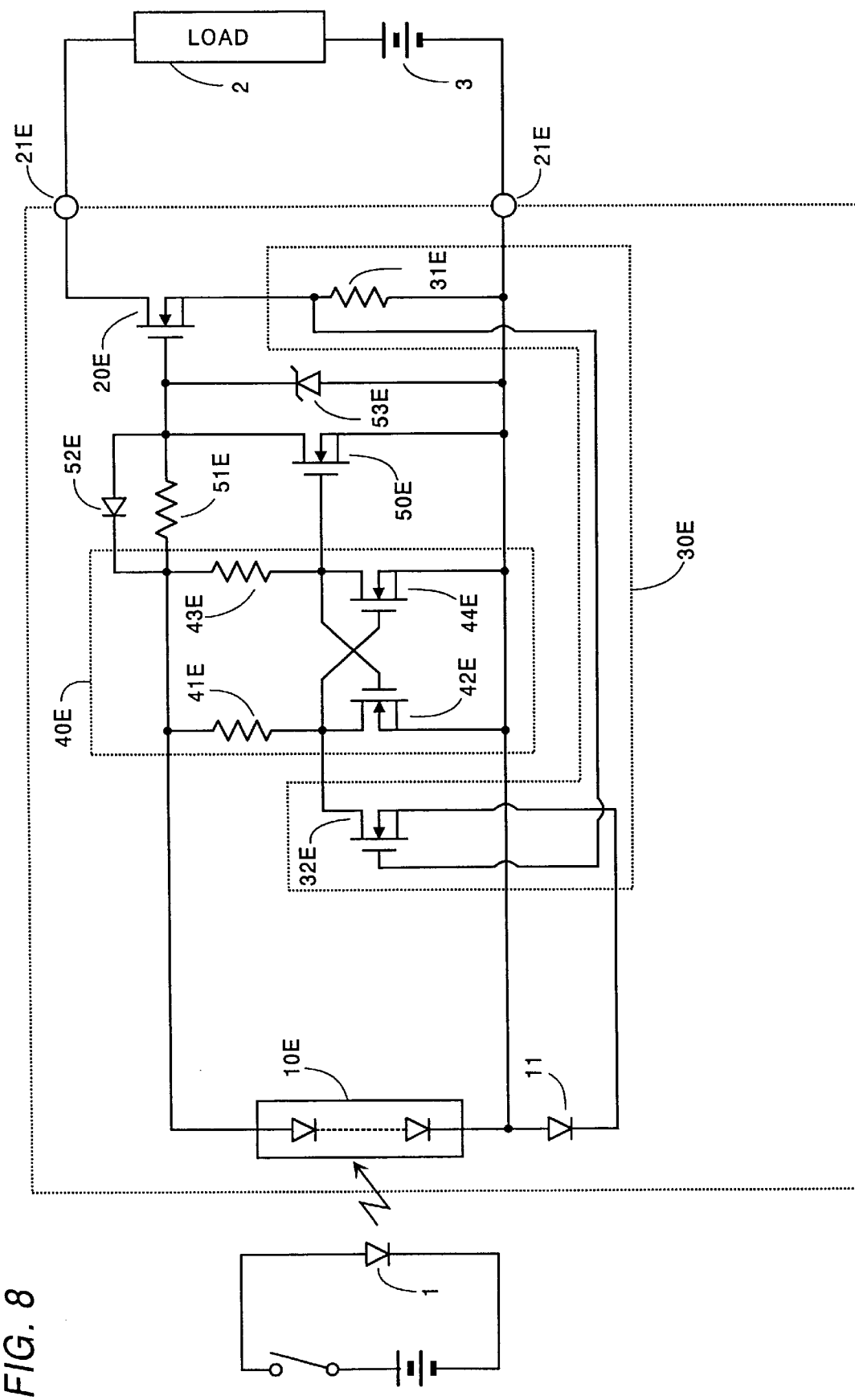
FIG. 8 is a circuit diagram of a light responsive semiconductor switch in accordance with a fourth embodiment of the present invention.

Fourth Embodiment <FIG. 8>

Referring to FIG. 8, there is shown a light responsive semiconductor switch in accordance with a fourth embodiment of the present invention which is identical to the first embodiment except for the inclusion of an additional photo-diode 11 to provide an offset voltage for improving sensitivity to the overcurrent. Like elements are designated by like reference numerals with a suffix letter of "E". The photo-diode 11 has its cathode connected to the source of MOSFET 32E and has its anode connected through the current sensing resistor 31E to the gate of MOSFET 32E, so that the offset voltage given by the photo-diode 11 is added to the voltage across the resistor 31E and is applied to the gate of MOSFET 32E. Thus, a relatively low detection voltage across the current sensing resistor 31E can successfully trigger the MOSFET 32E for increasing sensitivity of the overcurrent sensor 30E to the overcurrent condition. Therefore, the MOSFET 32E can well respond to a low level overcurrent for successful protection of the output MOSFET 20E therefrom.

Figure 9:
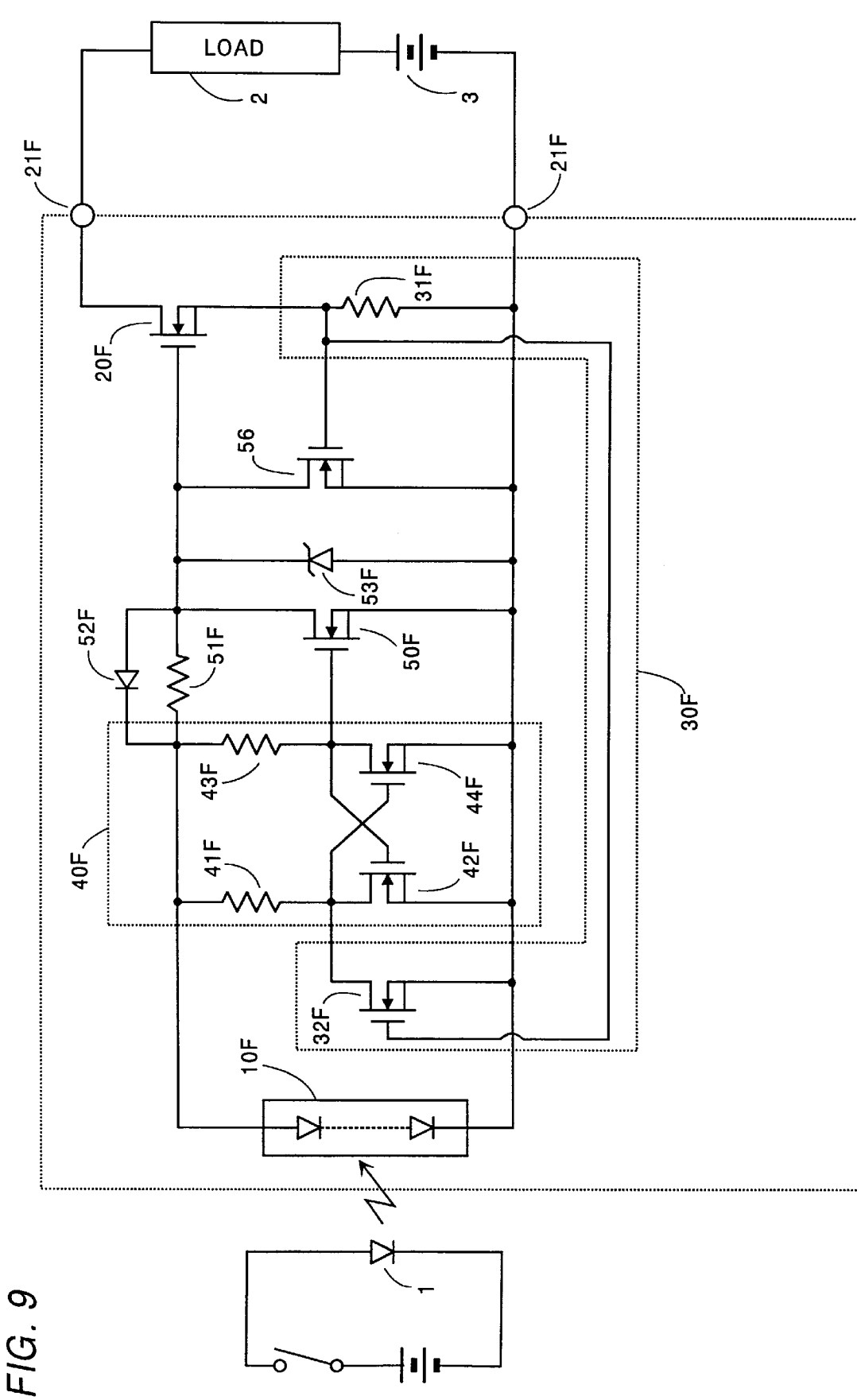
FIG. 9 is a circuit diagram of a light responsive semiconductor switch in accordance with a fifth embodiment of the present invention.

Fifth Embodiment <FIG.9>

Referring to FIG. 9, there is shown a light responsive semiconductor switch in accordance with a fifth embodiment of the present invention which is identical to the first embodiment except for the use of a second shunt MOSFET 56 whose drain-source is connected across drain-source of the shunt MOSFET 50F. Like elements are designated by like reference numerals with a suffix letter of "F". The second shunt MOSFET 56 has a gate-source connected across the current sensing resistor 31F to be triggered by the voltage developed across the resistor 31F. Thus, in response to the voltage of the resistor 31F exceeding the predetermined level, the second shunt MOSFET 56 becomes conductive to flow the current from the photo-diode array 10F through the current limiting resistor 51F away from the output MOSFET 20F prior to the latch circuit 40F responding to provide the interruption signal of turning on the shunt transistor 50F. Therefore, the output MOSFET 20F can be turned off for interruption of the overcurrent in prompt response to the overcurrent condition without having to wait for the actuation of the latch circuit 40F, and can be held turned off by the subsequently actuated latch circuit 40F.

Figure 10:
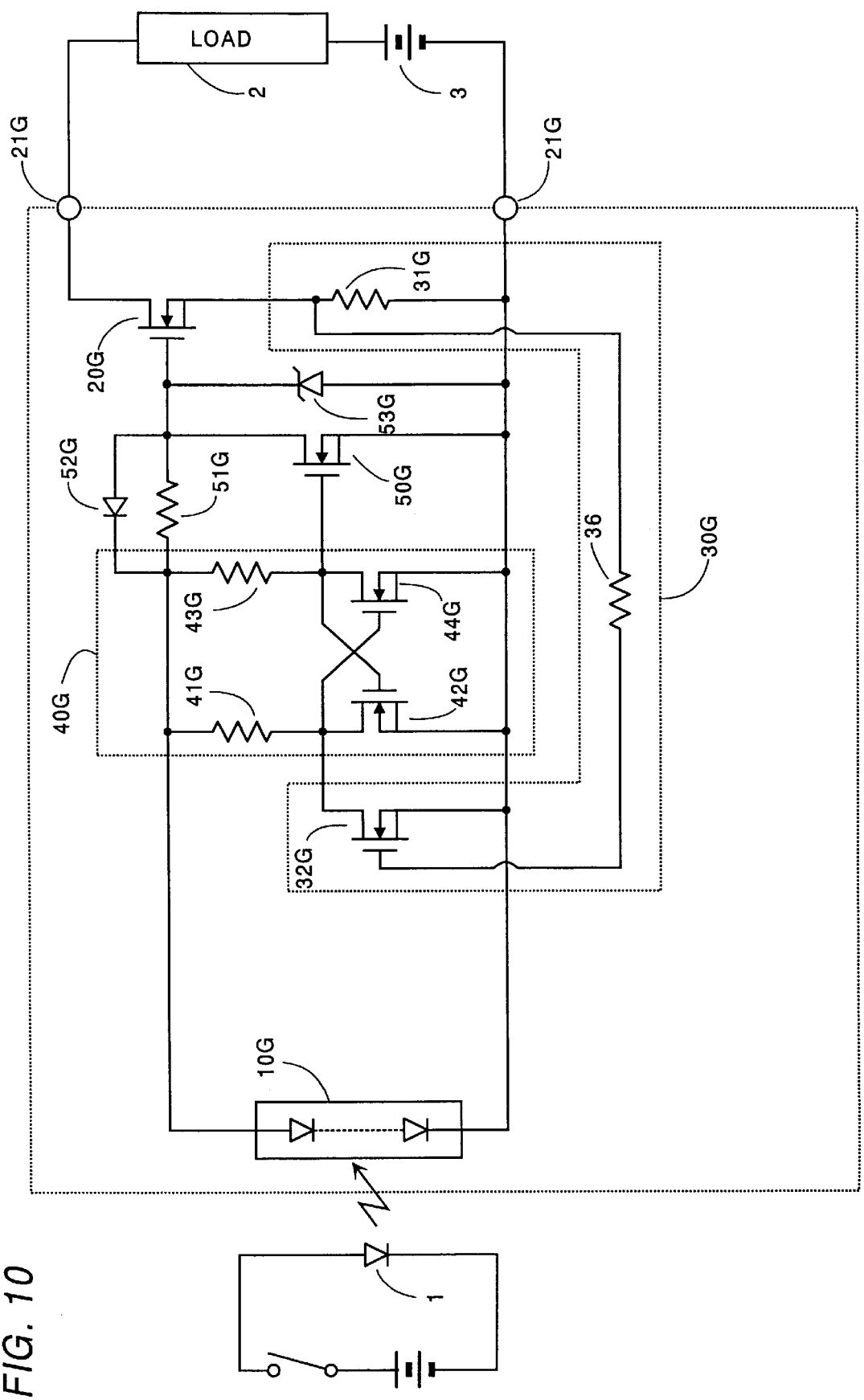
FIG. 10 is a circuit diagram of a light responsive semiconductor switch in accordance with a sixth embodiment of the present invention.

Sixth Embodiment <FIG. 10>

Referring to FIG. 10, there is shown a light responsive semiconductor switch in accordance with a sixth embodiment of the present invention which is identical to the first embodiment except that the overcurrent sensor 30G includes a low-pass filter. Like elements are designated by like reference numerals with a suffix letter of "G". The low pass filter is realized by an integrator which is composed of a resistor 36 is inserted between the current sensing resistor 31G and the gate of MOSFET 32G and a gate-source capacitance of MOSFET 32G. The integrator, i.e., the low-pass filter acts to cancel a high frequency voltage appearing across the current sensing resistor 31G so that the overcurrent sensor provides the overcurrent signal to the latch circuit 40G only when the resistor 31G provides the voltage which exceeds the predetermined level and which lasts over a certain time period. Thus, the latch circuit 40G is prevented from providing the interruption signal in response to a noncritical overcurrent appearing only instantaneously in the load circuit such as minor noises and rushing current which does not require the protection of the output switching transistor.

Figure 11:
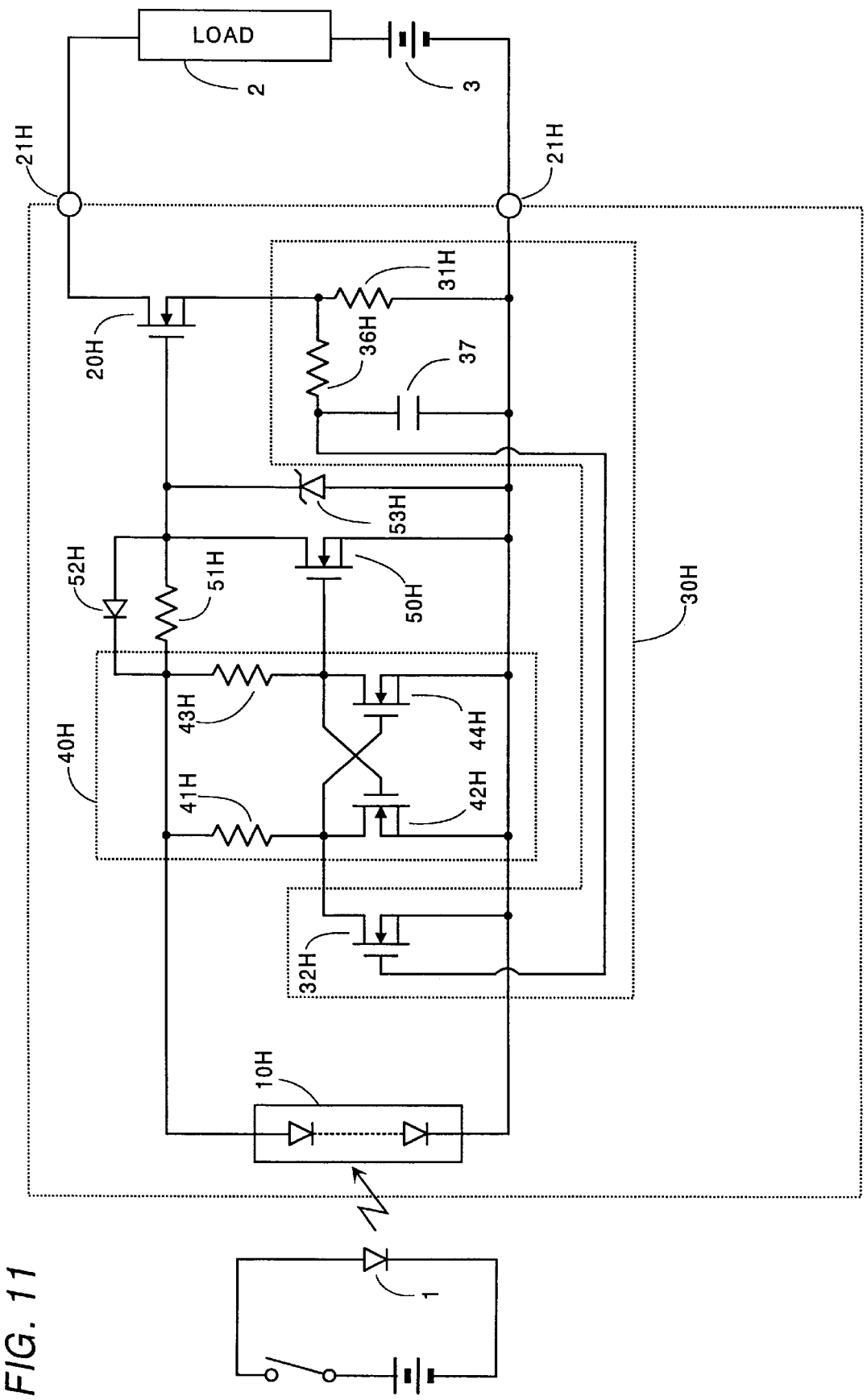
FIG. 11 is a circuit diagram illustrating a first modification of the sixth embodiment.

FIG. 11 shows a first modification of the sixth embodiment which is identical to the sixth embodiment except that a capacitor 37 is added in the overcurrent sensor 30H. Like elements are designated by like reference numerals with a suffix letter of "H". Capacitor 37 is connected in series with resistor 36H across the current sensing resistor 31H and is cooperative with resistor 36H to form a like low-pass filter which functions for the same purpose as described in the sixth embodiment.

Figure 12:
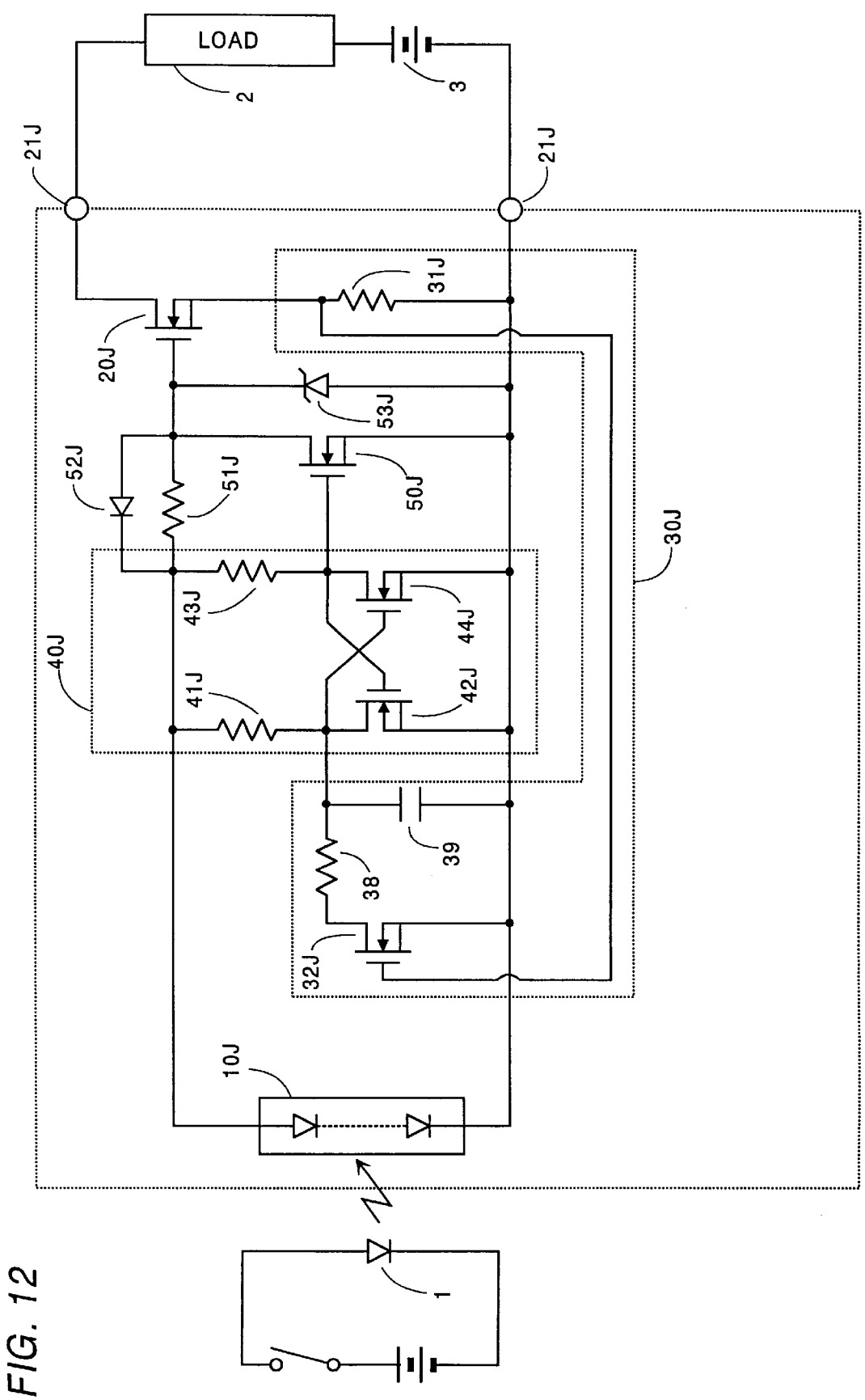
FIG. 12 is a circuit diagram illustrating a second modification of the sixth embodiment.

FIG. 12 shows a second embodiment of the sixth embodiment which is identical to the sixth embodiment except that the low-pass filter is realized by a resistor 38 and a capacitor 39 which are connected in series across the drain-source of MOSFET 32J. Like elements are designated by like reference numerals with a suffix letter of "J". Resistor 38 and capacitor 39 are cooperative to form an integrator which cancels the high frequency voltage appearing across the drain-source of MOSFET 32J, providing the overcurrent signal only when the resistor 31J provides the voltage which exceeds the predetermined level and which lasts over a certain time period. That is, MOSFET 44J is made non-conductive to issue the interruption signal to the shunt MOSFET 50J only in response to the above condition, and is otherwise kept conductive for preventing unintended interruption of the load current in response to the noncritical overcurrent appearing only instantaneously in the load circuit.

Figure 13:
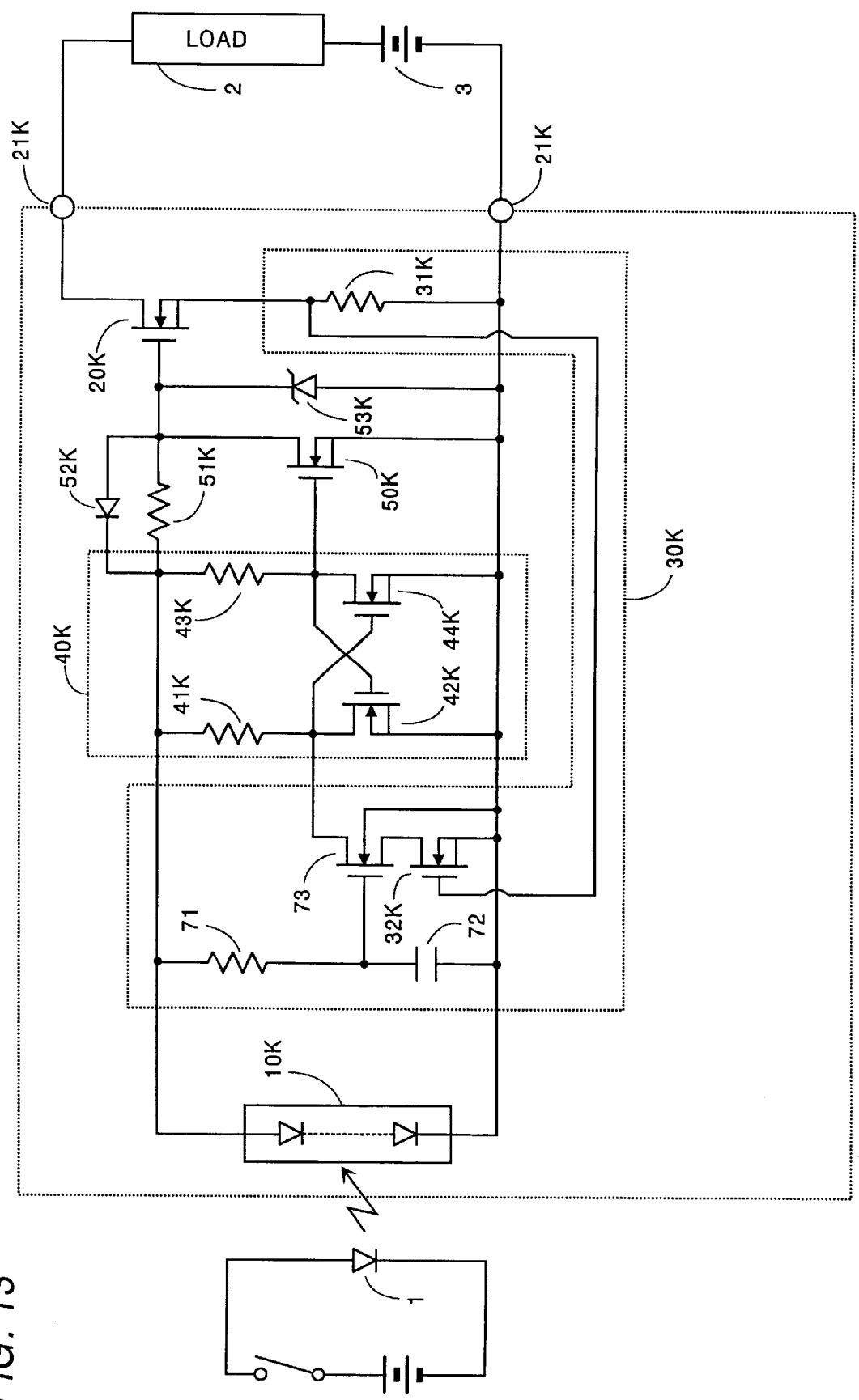
FIG. 13 is a circuit diagram of a light responsive semiconductor switch in accordance with a seventh embodiment of the present invention.

Seventh Embodiment <FIG. 13>

Referring to FIG. 13, there is shown a light responsive semiconductor switch in accordance with a seventh embodiment of the present invention which is identical to the first embodiment except that the overcurrent sensor 30K includes a delay timer composed of a resistor 71, a capacitor 72, and a MOSFET 73. Like elements are designated by like reference numerals with a suffix letter of "K". Resistor 71 is connected in series with capacitor 72 across the photo-diode array 10K. MOSFET 73 has a drain-source connected in series with the drain-source of MOSFET 32K across the drain-source of MOSFET 42K, and has a gate connected to a point between resistor 71 and capacitor 72. Thus, MOSFET 73 is made conductive to enable MOSFET 32K to provide the overcurrent signal to the latch circuit 40K only after a short time period from the activation of the photo-diode array 10K. In other words, the delay timer acts to delay providing the overcurrent signal from the overcurrent sensor 30K to the latch circuit 40K for the short time period immediately upon the photo-diode 10K generating the electric power, thereby canceling a transient voltage appearing across the current sensing resistor 31K immediately after the activation of the photo-diode array 10K.

Figure 14:
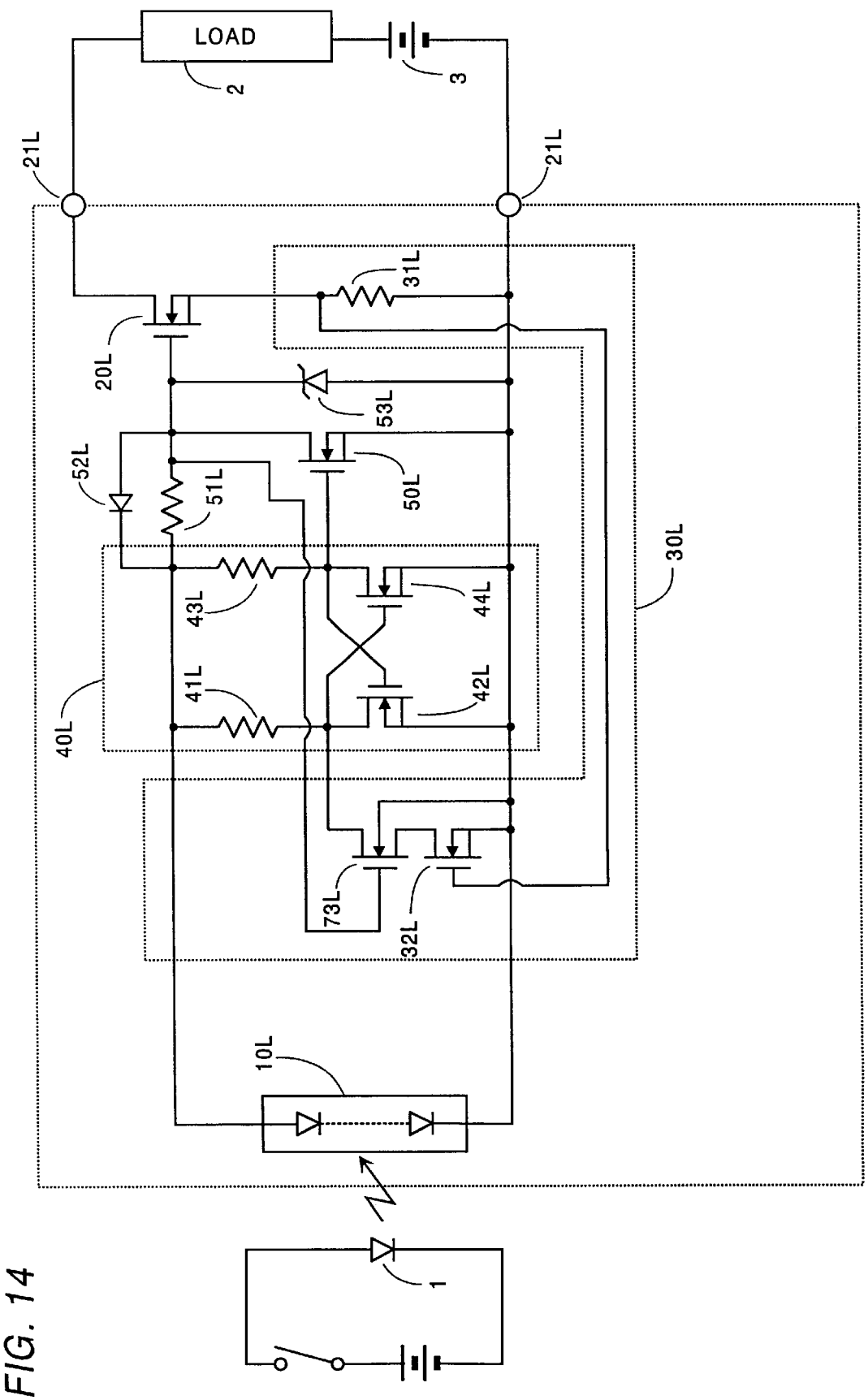
FIG. 14 is a circuit diagram illustrating a modification of the seventh embodiment.

FIG. 14 shows a modification of the seventh embodiment which is identical to the seventh embodiment except that MOSFET 73L has its gate connected through the current limiting resistor 51L to the positive electrode of the 10 photo-diode array 10L. Like elements are designated by like reference numerals with a suffix letter of "L". MOSFET 73L has an inherent gate-source capacitance which is cooperative with resistor 51L to form a like delay timer which functions for the same purpose as described in the seventh embodiment. Thus, the output MOSFET 20L can be prevented from responding to noncritical overcurrent appearing immediately after the activation of the photo-diode array 10L for assuring reliable switching operation.

Figure 15:
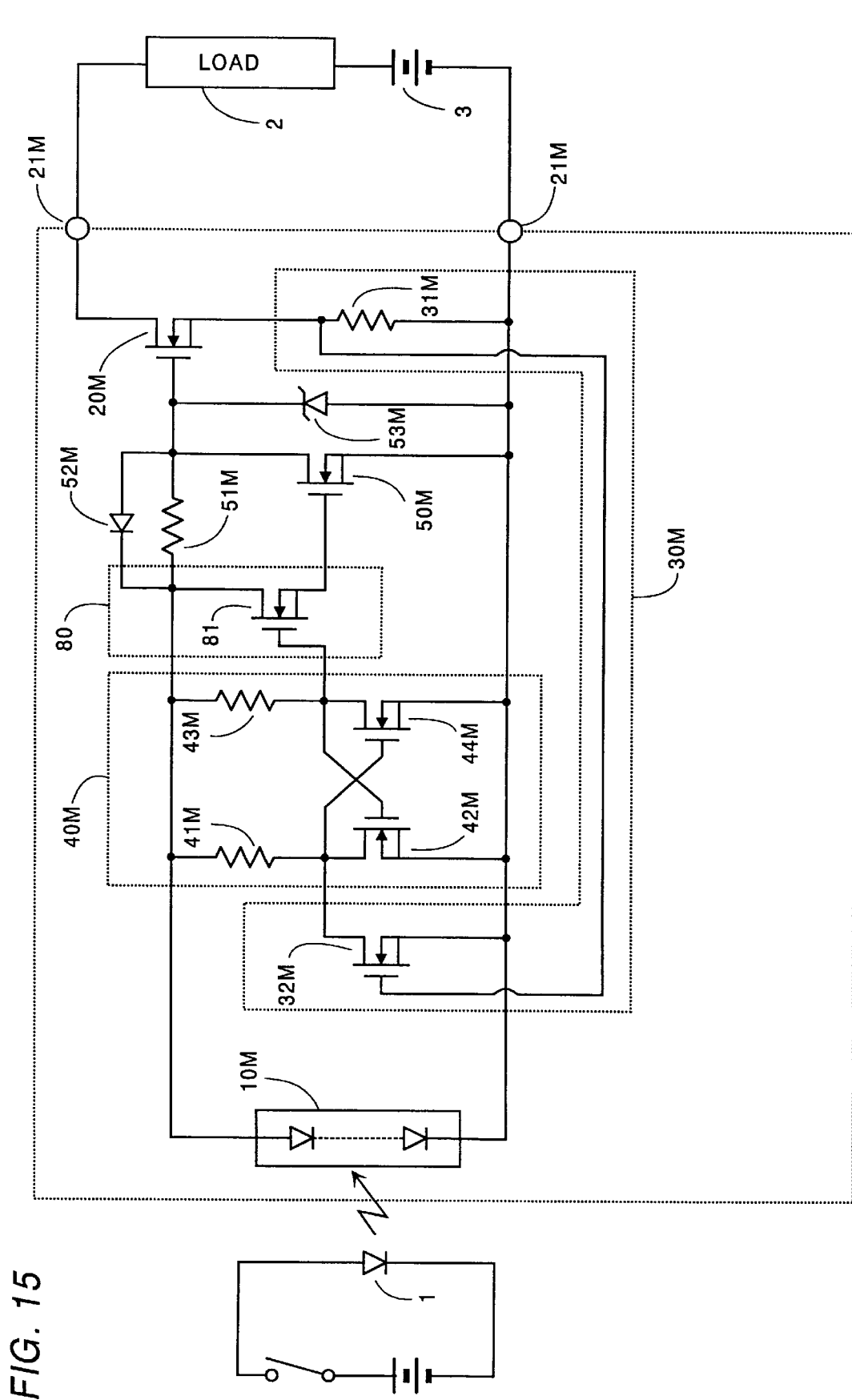
FIG. 15 is a circuit diagram of a light responsive semiconductor switch in accordance with an eight embodiment of the present invention.

Eighth Embodiment <FIG. 15>

Referring to FIG. 15, there is shown a light responsive semiconductor switch in accordance with an eighth embodiment of the present invention which is identical to the first embodiment except for the inclusion of a biasing circuit 80 for supplying a bias current from the photo-diode array 10M for rapid interruption of the overcurrent. Like elements are designated by like reference numerals with a suffix letter of "M". The biasing circuit 80 has a MOSFET 81 whose drain is connected to a point between the current limiting resistor 51M and the positive electrode of the photo-diode array 10M, and whose source is connected to the gate of shunt MOSFET 50M. The gate of MOSFET 81 is connected to the output of the latch circuit 40M, i.e., the connection between resistor 43M and MOSFET 44M so that, when the latch circuit 40M provides the interruption signal in response to the overcurrent condition, MOSFET 81 becomes conductive to supply the current from the photo-diode array 10M to the gate of shunt MOSFET 50M, thereby speeding up the conduction of shunt MOSFET 50M and therefore making a rapid interruption of the overcurrent in response to the overcurrent condition for protection of output MOSFET 20M as well as the associated elements effectively.

Figure 16:
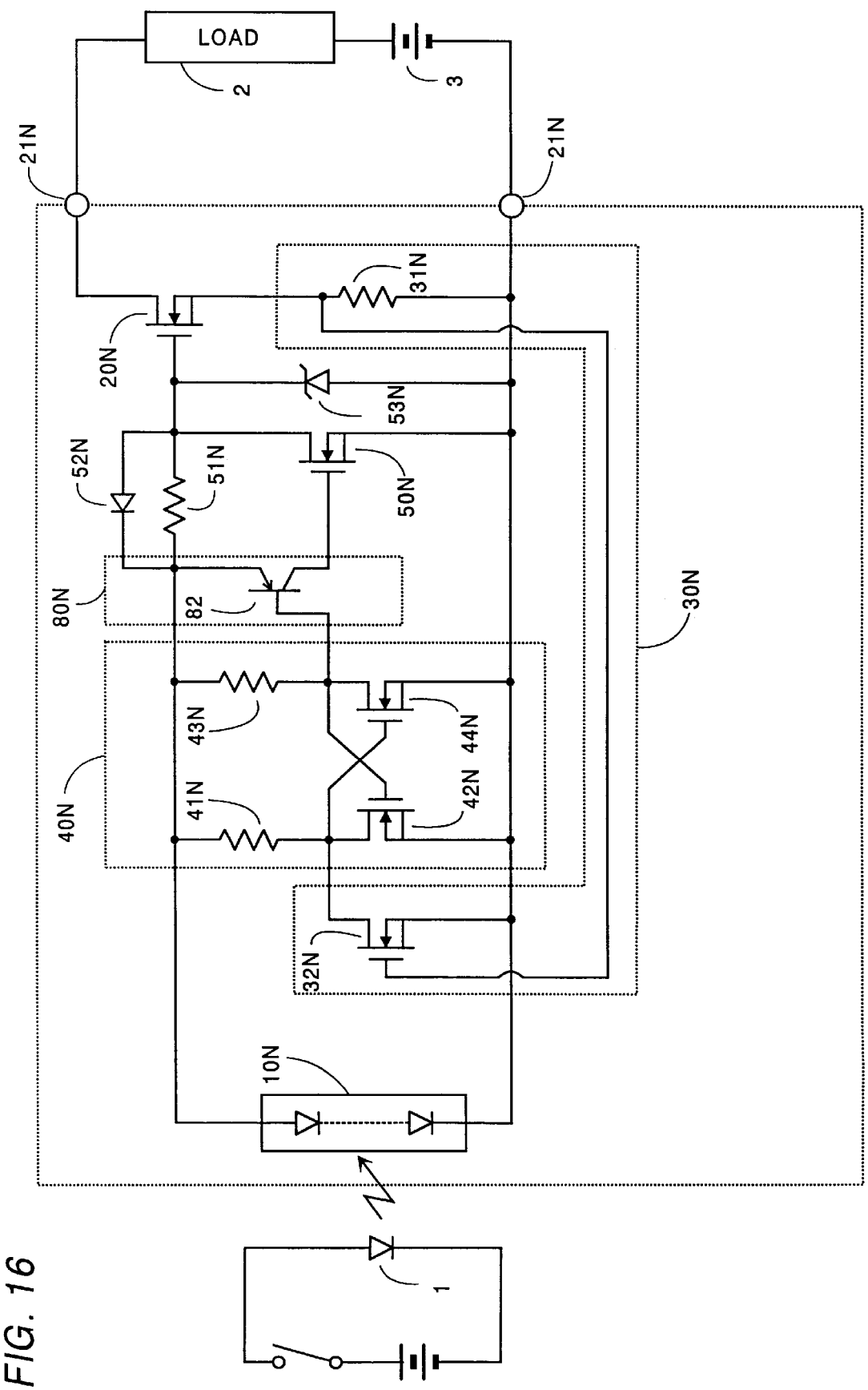
FIG. 16 is a circuit diagram illustrating a modification of the eighth embodiment.

FIG. 16 shows a modification of the eighth embodiment which is identical to the eighth embodiment except that a biasing circuit 80N includes a bipolar transistor 82 instead of MOSFET 81. Like elements are designated by like reference numerals with a suffix letter of "N". The transistor 82 has its collector connected to the point between resistor 51N and the positive electrode of the photo-diode array 10N, and has its emitter connected to the gate of shunt MOSFET 50N so as to provide the current from the array 10N to the gate of MOSFET 50N. The base of transistor 82 is connected to the output of the latch circuit so as to make the transistor 82 conductive in response to the overcurrent condition in the load circuit, thereby speeding up to trigger shunt MOSFET 50N for the same purpose of the eighth embodiment.

Figure 17:
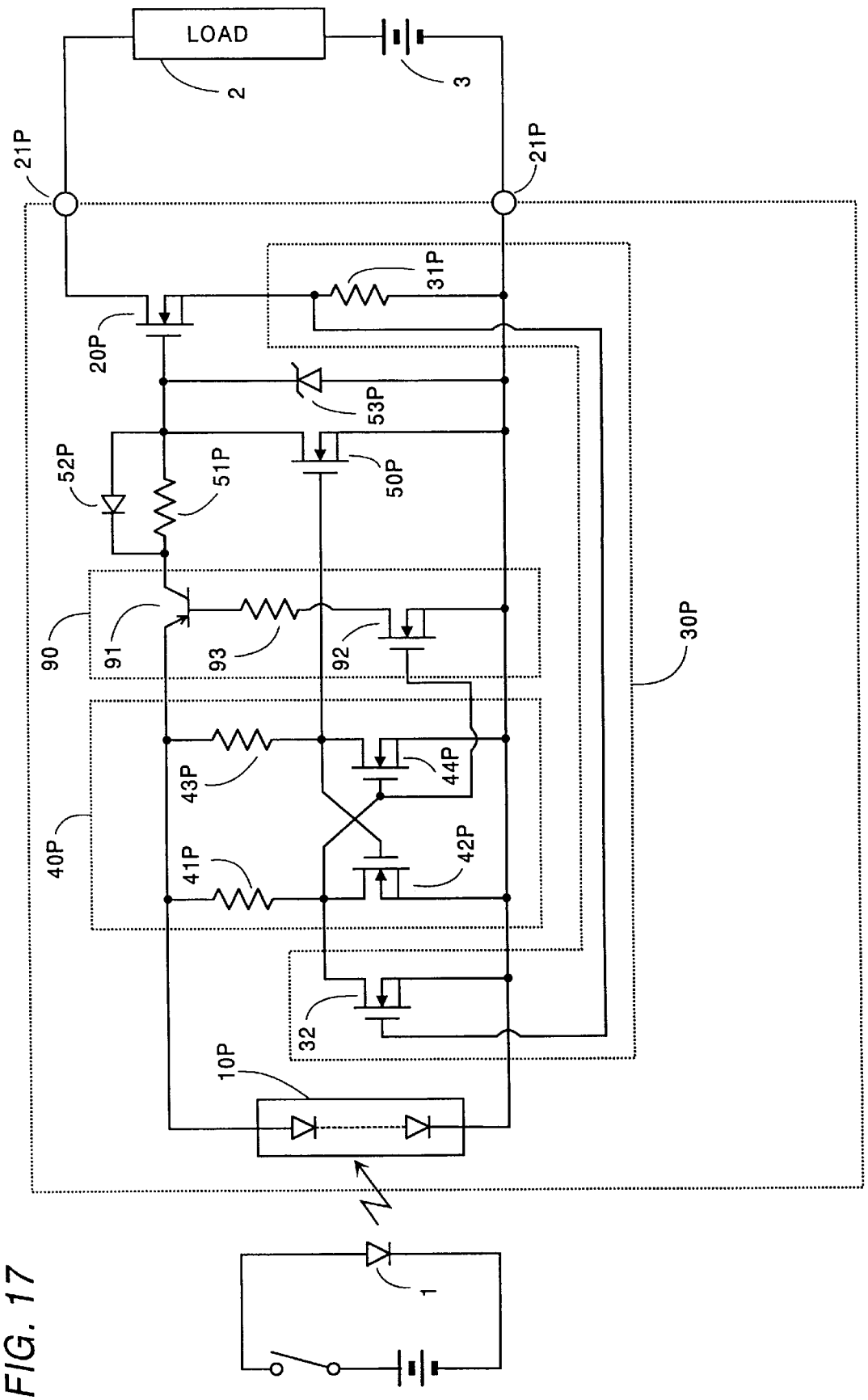
FIG. 17 is a circuit diagram of a light responsive semiconductor switch in accordance with a ninth embodiment of the present invention.

Ninth Embodiment <FIG. 17>

Referring to FIG. 17, there is shown a light responsive semiconductor switch in accordance with a ninth embodiment of the present invention which is identical to the first embodiment except for the provision of a block circuit 90 for blocking the current of the photo-diode array 10P from flowing to the gate of output MOSFET 20N when the latch circuit 40N provides the interruption signal in response to the overcurrent signal. Like elements are designated by like reference numerals with a suffix letter of "P". The block circuit 90 includes a bipolar transistor 91 whose collector-emitter is inserted between the current limiting resistor 51P and the photo-diode array 10P, and a MOSFET 92 whose source is connected through a resistor 93 to the base of transistor 91. The gate of MOSFET 92 is connected to the set input of the latch circuit 40P, i.e., the connection between resistor 41P and MOSFET 42P so that MOSFET 92 is made conductive together with MOSFET 44P upon activation of the photo-diode array 10P, and is made non-conductive together with MOSFET 44P in response to the overcurrent condition. That is, while the photo-diode array 10P is activated to turn on the output MOSFET 20P, MOSFET 92 responds to turn on and causes transistor 91 to turn on for keeping the output MOSFET 20P turned on. Upon seeing the overcurrent condition, MOSFET 92 is made non-conductive so as to turn off transistor 91, thereby blocking the current from the photo-diode array into the gate of the output MOSFET 20P. Thus, the current from the photo-diode array 10P is intensively utilized for triggering the shunt MOSFET 50P. That is, the current is caused to flow mainly through resistor 43P to the gate of shunt MOSFET 50P, triggering the same quickly for immediate protection of the output MOSFET 20P against the overcurrent condition.

Figure 18:
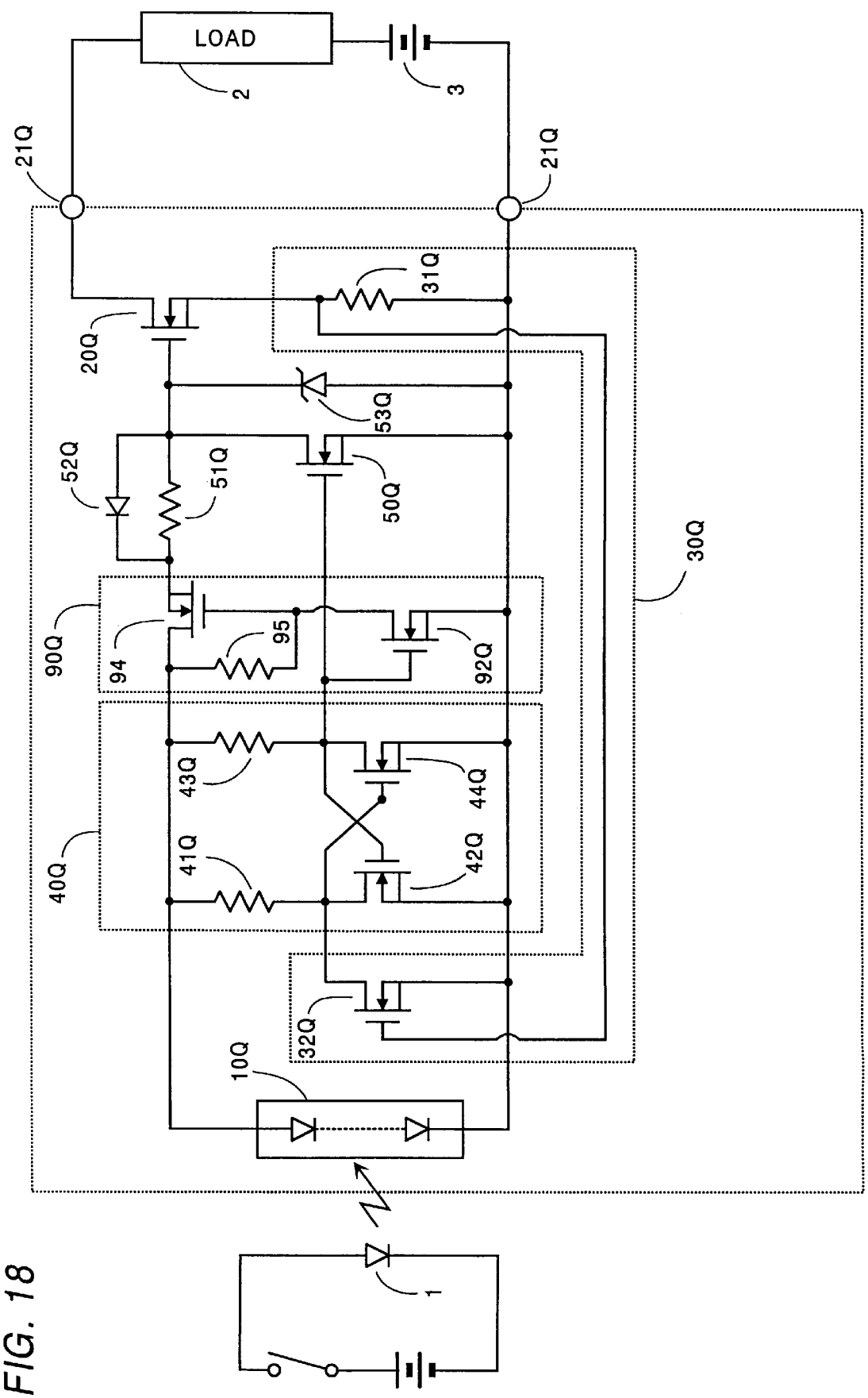
FIG. 18 is a circuit diagram illustrating a modification of the ninth embodiment.

FIG. 18 shows a modification of the ninth embodiment which is identical to the ninth embodiment except that a block circuit 90Q utilizes a MOSFET 94 instead of the bipolar transistor 91. Like elements are designated by like reference numerals with a suffix letter of "Q". MOSFET 94 has source-drain inserted between the current limiting resistor 51Q and the photo-diode array 10Q, and has a gate connected to the source of MOSFET 92Q. A resistor 95 is connected across the source-gate of MOSFET 94. MOSFET 92Q has its gate connected to the output of the latch circuit 40Q so that it is kept turned off together with the shunt MOSFET 50Q while the photo-diode array 10Q is activated for turning on output MOSFET 20Q. In this condition, MOSFET 94 is kept turn on to supply the current from the photo-diode array 10Q to the gate of output MOSFET 20Q. Upon detection of the overcurrent condition, the latch circuit 40Q causes MOSFET 92Q and shunt MOSFET 50Q to turn on simultaneously, which in turn makes MOSFET 94 non-conductive, thereby blocking the current from the photo-diode array 10Q towards output MOSFET 20Q. Thus, the current from the photo-diode array 10Q is prohibited from flowing into output MOSFET 20Q and is intensively utilized for triggering the shunt MOSFET 50Q for rapid interruption of the overcurrent flowing through output MOSFET 20Q.

Figure 19:
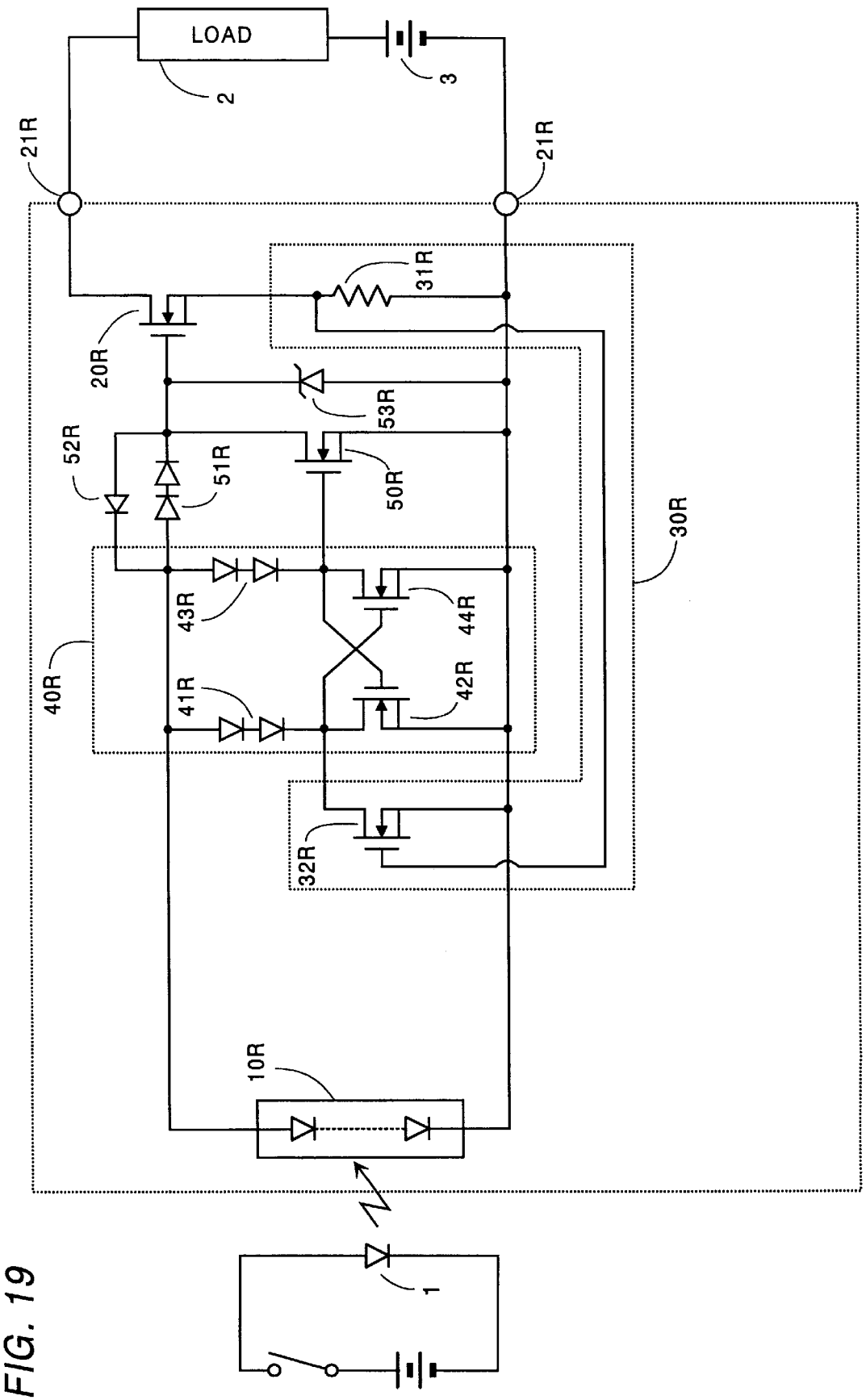
FIG. 19 is a circuit diagram illustrating a third modification of the first embodiment.

FIG. 19 shows a further modification of the first embodiment which is identical to the first embodiment except for the use of diode sets 51R, 41R, and 43R respectively as resistive elements of the circuit of the switch. Like elements are designated by like reference numerals with a suffix letter of "R". The number of diodes for each set are selected in accordance with a specific resistance required for the resistive element.

What is claimed is:

1. A light responsive semiconductor switch with shorted load protection, said switch comprising:

an output switching transistor connected between a pair of output terminals which are adapted to be connected to a load circuit composed of a load and a power source energizing said load, said output switching transistor having a control electrode with a threshold voltage at which said output switching transistor conducts to connect said load to said power source;

a photovoltaic element generating an electric power upon absorption of light from a light source across positive and negative electrodes of said photovoltaic element, said electric power providing an operating voltage decreasing with an increasing current flowing from said photovoltaic element;

an overcurrent sensor coupled to said load circuit to provide an overcurrent signal when said load circuit sees an overcurrent flowing through said load from said power source;

a shunt transistor connected in series with a current limiting resistive element across said photovoltaic element to define a shunt path of flowing the current from said photovoltaic element through said current limiting resistive element away from said output switching transistor; and a latch circuit connected to said overcurrent sensor and said shunt transistor, said latch circuit being energized by said photovoltaic element and providing an interruption signal once said overcurrent signal is received and hold said interruption signal after the removal of said overcurrent signal, said interruption signal causing said shunt transistor to become conductive to flow the current from said photovoltaic element through said shunt path, lowering said operating voltage being applied to said control electrode of said output switching transistor below said threshold voltage so as to turn off said output switching transistor for disconnection of said load from said power source;

wherein said shunt transistor and said current limiting resistive element are formed separately from said latch circuit; and that said current limiting resistive element is connected between said control electrode and the positive electrode of said photovoltaic element to limit the current from said photovoltaic element, when said shunt transistor is conductive, to such an extent as to lower the operating voltage being applied to said control electrode of said output switching transistor below said threshold voltage, while allowing the photovoltaic element to give a supply voltage to the latch circuit for holding said interruption signal.

2. The semiconductor switch as set forth in claim 1, wherein said overcurrent sensor comprises a current sensing resistor inserted in said load circuit, and a transistor switch which is connected to receive a voltage developed across said current sensing resistor to provide said overcurrent signal to said latch circuit when said voltage exceeds a predetermined level.

3. The semiconductor switch as set forth in claim 2, further including:

a second shunt transistor in the form of a metal oxide semiconductor field-effect transistor (MOSFET) connected across said shunt transistor with a drain of said second shunt transistor being connected to a point between the control electrode of said output switching transistor and said current limiting resistive element and with a source of said second shunt transistor being connected to the source of said shunt transistor, said second shunt transistor having a gate which is connected to receive the voltage developed across said current sensing resistor such that, in response to the voltage of said current sensing resistor exceeding the predetermined level, said second shunt transistor becomes conductive to flow the current from said photovoltaic element through said current limiting resistive element and through said second shunt transistor away from said output switching transistor prior to said latch circuit responding to provide said interruption signal of turning on said shunt transistor.

4. The semiconductor switch as set forth in claim 2, wherein said overcurrent sensor further include a low-pass filter which negates a high frequency voltage appearing across said current sensing resistor so that said overcurrent sensor provides said overcurrent signal to said latch circuit only when the voltage across the current sensing resistor exceeds said predetermined level and lasts over a certain time period.

5. The semiconductor switch as set forth in claim 2, further including a delay timer which delays providing said overcurrent signal from said overcurrent sensor to said latch circuit for a short time period immediately upon said photovoltaic element generating the electric power, thereby negating a transient voltage appearing across said current sensing resistor immediately after the activation of said photovoltaic element.

6. The semiconductor switch as set forth in claim 1, wherein said overcurrent sensor comprises a current sensing resistor connected in series with a bypass switching transistor across said output terminals in parallel with said output switching transistor, and a transistor switch which is connected to receive a voltage developed across said current sensing resistor to provide said overcurrent signal to said latch circuit when said voltage exceeds a predetermined level.

7. The semiconductor switch as set forth in claim 1, wherein said output switching transistor comprises a single metal oxide semiconductor field-effect transistor (MOSFET) whose gate-source is connected across said photovoltaic element, and whose drain-source is connected between said output terminals.

8. The semiconductor switch as set forth in claim 1, wherein a pair of output switching transistors each in the form of a metal oxide semiconductor field-effect transistor (MOSFET) are connected in series between said output terminals with sources of the individual MOSFETs being connected to each other and with gates of the individual MOSFETs being commonly connected to receive said operating voltage from said photovoltaic element.

9. The semiconductor switch as set forth in claim 1, wherein said latch circuit is realized by a flip flop having a set input, a reset input, and an output, said set input being connected to receive said overcurrent signal, said reset input being connected to receive said operating voltage from said photovoltaic element, and said output being connected to turn on and off said shunt transistor.

10. The semiconductor switch as set forth in claim 9, wherein said shunt transistor is realized by a metal oxide semiconductor field-effect transistor (MOSFET) whose drain-source is connected in series with said current limiting resistive element across said photovoltaic element, and wherein said flip-flop comprises:

a first resistive element and a first metal oxide semiconductor field-effect transistor (MOSFET) whose drain-source is connected in series with said first resistive element across said photovoltaic element, and a second resistive element and a second metal oxide semiconductor field-effect transistor (MOSFET) whose drain-source is connected in series with said second resistive element across said photovoltaic element, said first MOSFET having a gate connected to a point between said second resistive element and a drain of said second MOSFET, said second MOSFET having a gate connected to a point between said first resistive element and a drain of said first MOSFET, said point between the second resistive element and the drain of said second MOSFET being connected to the gate of said shunt transistor (MOSFET), said second MOSFET receiving at its gate the operating voltage from said photovoltaic element through said first resistive element so as to become conductive upon receiving said operating voltage, thereby lowering said operating voltage applied through said second resistive element to the gate of said first MOSFET and to the gate of said shunt transistor (MOSFET) to make said first MOSFET and said shunt transistor nonconductive, said second MOSFET also receiving at its gate said overcurrent signal which makes said second MOSFET nonconductive, thereby raising the voltage applied to the gates of said first MOSFET and said shunt transistor (MOSFET) so as to make said first MOSFET and said shunt transistor (MOSFET) conductive, which keeps said second MOSFET nonconductive for continued conduction of said shunt transistor (MOSFET) for keeping the interruption of said output switching transistor until removal of the operating voltage from said photovoltaic element.

11. The semiconductor switch as set forth in claim 10, wherein each of said current limiting resistive element, said first resistive element and said second resistive element is in the form of a punch-through space charge resistor, said punch-through space charge resistor comprising:

a semiconductor substrate having a conductive type which is one of n-type and p-type;

a well diffused in the surface of said substrate, said well being of a conductive type opposite of said substrate;

a pair of regions diffused in the surface of said well in a spaced relation with each other, said regions being of the same conductive type as said substrate; and a pair of electrodes respectively formed on said regions to apply said operating voltage between said regions partly through said well, said regions being cooperative to form therebetween a depletion layer responsible for carrying a minute current and therefore defining resistance for each of said current limiting resistive element, said first resistive element and said second resistive element.

12. The semiconductor switch as set forth in claim 10, wherein said current limiting resistive element, said first resistive element and said second resistive element are realized by diodes, respectively.

13. The semiconductor switch as set forth in claim 10, further including an additional photovoltaic element which provides an offset voltage upon absorption of the light, said overcurrent sensor comprising a current sensing resistor inserted in said load circuit to develop a detection voltage thereacross, and a third metal oxide semiconductor field-effect transistor (MOSFET) which provides said overcurrent signal to said latch circuit upon being turned on, said additional photovoltaic element being connected to said third MOSFET such that said offset voltage is added to said detection voltage and is applied to a gate of said third MOSFET for turning on said third MOSFET when said detected voltage plus said offset voltage exceed a predetermined level.

14. The semiconductor switch as set forth in claim 10, further including a biasing means for supplying a bias current from said photovoltaic element to the gate of said shunt transistor when said latch circuit provides the interruption signal in response to said overcurrent signal.

15. The semiconductor switch as set forth in claim 10, further including a block means for blocking the current of said photovoltaic element from flowing to the gate of the output switching transistor when said latch circuit provides the interruption signal in response to said overcurrent signal.

16. The semiconductor switch as set forth in claim 1, wherein said output switching transistor is in the form of a metal oxide semiconductor field-effect transistor (MOSFET) having a gate defining said control electrode, a zener diode being connected across gate-source of said output switching transistor in parallel with said photovoltaic element, a cathode of said zener diode being connected to the gate of said output switching transistor, said zener diode having a breakdown voltage higher than an open-circuit voltage of said photovoltaic element.

17. The semiconductor switch as set forth in claim 1, wherein said output switching transistor is in the form of a metal oxide semiconductor field-effect transistor (MOSFET) having a gate defining said control electrode, a diode being connected across said current limiting resistive element with an anode of said diode connected to the gate of said output switching transistor.

18. The semiconductor switch as set forth in claim 1, wherein said output switching transistor is in the form of a metal oxide semiconductor field-effect transistor (MOSFET) having a gate defining said control electrode, a diode being connected in series with a resistor across said current limiting resistive element with an anode of said diode connected to the gate of said output switching transistor.

19. The semiconductor switch as set forth in claim 1, wherein said output switching transistor is in the form of a metal oxide semiconductor field-effect transistor (MOSFET) having a gate defining said control electrode, a discharging metal oxide semiconductor field-effect transistor (MOSFET) being connected across said current limiting resistive element with a source of said discharging MOSFET being coupled to a connection between said current limiting resistive element and the positive electrode of said photovoltaic element and with drain and gate of said discharging MOSFET commonly connected to the gate of said output switching transistor.

* * * * *